(12) United States Patent
Park

(10) Patent No.: US 11,793,029 B2
(45) Date of Patent: *Oct. 17, 2023

(54) ELECTROLUMINESCENT DEVICE HAVING LIGHT TRANSMITTING REGION OF NON-THROUGH-HOLE STRUCTURE

(71) Applicant: Samsung Display Co., Ltd., Yongin-si (KR)

(72) Inventor: Myoung Seo Park, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/976,845

(22) Filed: Oct. 30, 2022

(65) Prior Publication Data

US 2023/0052946 A1 Feb. 16, 2023

Related U.S. Application Data

(60) Continuation of application No. 17/579,544, filed on Jan. 19, 2022, now Pat. No. 11,515,507, which is a
(Continued)

(30) Foreign Application Priority Data

Jan. 8, 2018 (KR) .................. 10-2018-0002480
Jul. 30, 2018 (KR) .................. 10-2018-0088581

(51) Int. Cl.
*H01L 51/52* (2006.01)
*H01L 51/50* (2006.01)
(Continued)

(52) U.S. Cl.
CPC ......... *H10K 50/8445* (2023.02); *H10K 50/11* (2023.02); *H10K 50/15* (2023.02);
(Continued)

(58) Field of Classification Search
CPC ............ H01L 51/5256; H01L 27/3272; H01L 27/3246; H01L 51/5234; H01L 27/323;
(Continued)

(56) References Cited

U.S. PATENT DOCUMENTS 7,733,010 B2 6/2010 Lee et al.
9,940,888 B2 4/2018 Ryoo et al.
(Continued)

FOREIGN PATENT DOCUMENTS

KR 10-1325577 11/2013
KR 10-2014-0038827 3/2014
(Continued)

OTHER PUBLICATIONS

Non-Final Office Action dated Oct. 18, 2019, issued in U.S. Appl. No. 16/241,907.
(Continued)

*Primary Examiner* — Tracie Y Green
(74) *Attorney, Agent, or Firm* — H.C. Park & Associates, PLC

(57) ABSTRACT

An electroluminescent device including a lower substrate; a lower structure including an inorganic multilayer; and an upper encapsulation structure, in which the lower structure includes a display region inside an outline of the inorganic multilayer, and a light transmitting region having a non-through-hole structure having at least a portion surrounded by the display region; the lower structure has an inorganic surface portion surrounding the display and light transmitting regions, the upper encapsulation structure has an inorganic lower surface forming an inorganic-inorganic encapsulation contact region; the electroluminescent device does not have a hole formed through both the lower substrate and the lower structure, a portion of the upper encapsulation structure corresponding to the light transmitting region is not
(Continued)

removed, and a portion of the pixel definition layer, the portion corresponding to the light transmitting region, is not present.

25 Claims, 25 Drawing Sheets

Related U.S. Application Data continuation of application No. 17/139,476, filed on Dec. 31, 2020, now Pat. No. 11,251,404, which is a continuation of application No. 16/836,933, filed on Apr. 1, 2020, now Pat. No. 10,910,600, which is a division of application No. 16/241,907, filed on Jan. 7, 2019, now Pat. No. 10,818,874.

(51) Int. Cl.
| | |
|---|---|
| *H01L 27/32* | (2006.01) |
| *H10K 50/844* | (2023.01) |
| *H10K 50/11* | (2023.01) |
| *H10K 50/15* | (2023.01) |
| *H10K 50/16* | (2023.01) |
| *H10K 50/818* | (2023.01) |
| *H10K 50/828* | (2023.01) |
| *H10K 59/121* | (2023.01) |
| *H10K 59/122* | (2023.01) |
| *H10K 59/126* | (2023.01) |
| *H10K 50/86* | (2023.01) |
| *H10K 50/824* | (2023.01) |
| *H10K 50/856* | (2023.01) |
| *H10K 59/40* | (2023.01) |
| *H10K 102/00* | (2023.01) |

(52) U.S. Cl.
CPC .......... *H10K 50/16* (2023.02); *H10K 50/818* (2023.02); *H10K 50/828* (2023.02); *H10K 59/121* (2023.02); *H10K 59/122* (2023.02); *H10K 59/126* (2023.02); *H10K 50/824* (2023.02); *H10K 50/856* (2023.02); *H10K 50/86* (2023.02); *H10K 59/40* (2023.02); *H10K 2102/3026* (2023.02)

(58) Field of Classification Search
CPC ......... H01L 2251/5315; H01L 51/5281; H01L 51/5228; H01L 27/326; H01L 51/5271
See application file for complete search history.

(56) References Cited

U.S. PATENT DOCUMENTS

| | | | |
|---|---|---|---|
| 10,109,692 B2 | 10/2018 | Senda et al. | |
| 10,340,476 B2 | 7/2019 | Park | |
| 10,818,874 B2 | 10/2020 | Park | |
| 10,910,600 B2 | 2/2021 | Park | |
| 10,978,666 B2 | 4/2021 | Park | |
| 11,127,920 B2 | 9/2021 | Park | |
| 11,444,261 B2 | 9/2022 | Park | |
| 11,515,507 B2 * | 11/2022 | Park | H10K 50/828 |
| 2008/0117497 A1 | 5/2008 | Shimodaira | |
| 2009/0257105 A1 | 10/2009 | Xu et al. | |
| 2013/0313672 A1 | 11/2013 | Min | |
| 2014/0021574 A1 | 1/2014 | Egawa | |
| 2014/0145155 A1 | 5/2014 | Park | |
| 2016/0126494 A1 | 5/2016 | Jung et al. | |
| 2016/0170524 A1 | 6/2016 | Kim et al. | |
| 2016/0221293 A1 | 8/2016 | Park | |
| 2016/0254479 A1 | 9/2016 | Jeong et al. | |
| 2016/0337570 A1 | 11/2016 | Tan et al. | |
| 2017/0047544 A1 | 2/2017 | Kang et al. | |
| 2017/0077456 A1 | 3/2017 | Chung et al. | |
| 2017/0148856 A1 | 5/2017 | Choi et al. | |
| 2017/0154566 A1 | 6/2017 | Ryoo et al. | |
| 2017/0162111 A1 | 6/2017 | Kang et al. | |
| 2017/0162637 A1 | 6/2017 | Choi et al. | |
| 2017/0187934 A1 | 6/2017 | Kwak et al. | |
| 2017/0199400 A1 | 7/2017 | Mok et al. | |
| 2017/0237037 A1 | 8/2017 | Choi et al. | |
| 2017/0237038 A1 | 8/2017 | Kim et al. | |
| 2017/0256747 A1 | 9/2017 | Lee et al. | |
| 2017/0287992 A1 | 10/2017 | Kwak et al. | |
| 2017/0289324 A1 | 10/2017 | Yeo et al. | |
| 2017/0294502 A1 | 10/2017 | Ka et al. | |
| 2018/0138450 A1 | 5/2018 | Park et al. | |
| 2019/0214595 A1 | 7/2019 | Park | |

FOREIGN PATENT DOCUMENTS

| | | |
|---|---|---|
| KR | 10-2017-0064598 | 6/2017 |
| KR | 10-2017-0065059 | 6/2017 |
| KR | 10-2017-0095444 | 8/2017 |
| KR | 10-2017-0104097 | 9/2017 |
| KR | 10-2017-0111827 | 10/2017 |
| KR | 10-2017-0113932 | 10/2017 |
| KR | 10-2017-0117291 | 10/2017 |
| KR | 10-2017-0140136 | 12/2017 |

OTHER PUBLICATIONS

Notice of Allowance dated Jan. 10, 2020, issued in U.S. Appl. No. 16/241,907.
Notice of Allowance dated May 13, 2020, in U.S. Appl. No. 16/241,907.
Final Office Action dated Aug. 26, 2020, in U.S. Appl. No. 15/976,210.
Non-Final Office Action dated Jul. 9, 2020, issued in U.S. Appl. No. 16/836,933.
Notice of Allowance dated Sep. 30, 2020, issued in U.S. Appl. No. 16/836,933.
Notice of Allowance dated Oct. 8, 2020, issued in U.S. Appl. No. 17/139,476.
Final Office Action dated Oct. 7, 2022, issued to U.S. Appl. No. 17/406,606.
Notice of Allowance dated Sep. 14, 2022, issued to U.S. Appl. No. 17/579,544.

* cited by examiner

ELECTROLUMINESCENT DEVICE HAVING LIGHT TRANSMITTING REGION OF NON-THROUGH-HOLE STRUCTURE

CROSS-REFERENCES TO RELATED APPLICATIONS

This application is a continuation of U.S. patent application Ser. No. 17/579,544, filed on Jan. 19, 2022, which is a continuation of U.S. patent application Ser. No. 17/139,476, filed on Dec. 31, 2020, now issued as U.S. Pat. No. 11,251,404, which is a continuation of U.S. patent application Ser. No. 16/836,933, filed on Apr. 1, 2020, now issued as U.S. Pat. No. 10,910,600, which is a divisional of U.S. patent application Ser. No. 16/241,907, filed on Jan. 7, 2019, now issued as U.S. Pat. No. 10,818,874, and claims priority from and the benefit of Korean Patent Application No. 10-2018-0002480, filed on Jan. 8, 2018, and Korean Patent Application No. 10-2018-0088581, filed on Jul. 30, 2018, which are hereby incorporated by reference for all purposes as if fully set forth herein.

BACKGROUND

Field

Exemplary embodiments of the invention relate generally to an electroluminescent device, and, more specifically, to an electroluminescent device having a light transmitting area.

Discussion of the Background

Recently, because various portable types of electronic devices include a camera function, a case in which only one electronic device in which the camera function is built in is carried has increased at a rapid rate compared to a case in which a camera is separately carried.

In the conventional art, because the camera is provided outside of an image display region of the electronic device, there is a tendency for a space where the electronic device may display an image to be decreased.

To counter this trend, U.S. Patent Application Publication No. 2016-0337570 and others disclose a structure in which the camera is located in the display region.

The above information is only for enhancement of understanding of the background of the invention and therefore it may contain information that does not form the prior art that is already known in this country to a person of ordinary skill in the art.

The above information disclosed in this Background section is only for understanding of the background of the inventive concepts, and, therefore, it may contain information that does not constitute prior art.

SUMMARY

When an electroluminescent device may have a light transmitting region, a problem that an internal light emitted from a pixel or an external light enters into the light transmitting region occurs. Also, when irradiating a laser for forming the light transmitting region, a problem that the pixels in a display region may be damaged occurs. In addition, when forming the light transmitting region having a through-hole structure by stacking a common intermediate layer and a common upper electrode and, then, removing portions of the common intermediate layer and the common upper electrode corresponding to a through-hole by a laser, the portions of the common intermediate layer and the common upper electrode must be clearly removed. However, there may be problems that the portions of the common intermediate layer and the common upper electrode may be not clearly removed.

Exemplary embodiments are to eliminate at least one among these problems.

An electroluminescent device according to exemplary embodiments may include a lower structure and an encapsulation structure. The encapsulation structure may be disposed on the lower structure. The lower structure may include an inorganic multilayer, a planarization layer, a reflecting electrode, a pixel definition layer, an intermediate multilayer, and a semi-transparent electrode. The planarization layer may be substantially transparent and may be disposed on the inorganic multilayer. The reflecting electrode may be an individual layer disposed on the planarization layer. The pixel definition layer may be substantially transparent, may be disposed on the planarization layer and may include a pixel definition portion and a first spacer. The pixel definition portion may cover a side portion of the reflecting electrode. The first spacer may have a substantially higher height than the pixel definition portion. The reflecting electrode may not be disposed under the first spacer. The intermediate multilayer may be disposed on the reflecting electrode and may have at least one intermediate common layer. The semi-transparent electrode may be a common layer disposed on the intermediate multilayer. The lower structure may have a light transmitting region and a display region surrounding at least a portion of the light transmitting region. The first spacer and a portion of the planarization layer, the portion being disposed under the first spacer, may be included in the light transmitting region. An electroluminescent unit including the reflecting electrode, the intermediate multilayer, and the semi-transparent electrode may be included in the display region. The first spacer may not be covered by at least one selected from the group of the intermediate common layer and the semi-transparent electrode. As one example, the first spacer may not be covered by the intermediate common layer and the first spacer may not be covered by the semi-transparent electrode. As another example, the first spacer may not be covered by the intermediate common layer and the first spacer may be covered by the semi-transparent electrode. As still another example, the first spacer may be covered by the intermediate common layer and the first spacer may not be covered by the semi-transparent electrode.

The pixel definition layer may further include a second spacer having substantially the same height as the first spacer and having a substantially smaller area than the first spacer. The intermediate multilayer may further include at least one intermediate individual layer. The intermediate individual layer may not cover the first and second spacers. The intermediate common layer and the semi-transparent electrode may cover the second spacer.

The lower structure may further include a substrate disposed under the inorganic multilayer. The inorganic multilayer may have at least one recess disposed under the first spacer and filled with the planarization layer or at least one hole disposed under the first spacer and filled with the planarization layer.

The lower structure may further include a passivation layer being a semi-conductive or conductive common layer disposed on the semi-transparent electrode. The passivation layer may not cover the first spacer.

The lower structure may have a buffer region having at least a portion extending along an outline of the light transmitting region between the display region and the light transmitting region to separate the display region and the light transmitting region from each other. The lower structure may have an inorganic surface portion substantially surrounding the display region and the light transmitting region. The encapsulation structure may have an inorganic lower surface. The inorganic lower surface of the encapsulation structure may be in contact with the inorganic surface portion of the lower structure to form an inorganic-inorganic encapsulation contact region substantially surrounding the display region and the light transmitting region. For example, the inorganic-inorganic encapsulation contact region may completely surround the display region and the light transmitting region.

Another electroluminescent device according to exemplary embodiments may include a lower structure and an encapsulation structure. The encapsulation structure may be disposed on the lower structure. The lower structure may include a display region, a light transmitting region, and a buffer region. The light transmitting region may have a non-through-hole structure including at least a portion surrounded by the display region. The buffer region may have at least a portion extending along an outline of the light transmitting region between the display region and the light transmitting region to separate the display region and the light transmitting region from each other. The lower structure may further include a light blocking structure extending along the outline of the light transmitting region in the at least the portion of the buffer region.

The lower structure may further include an inorganic multilayer, a planarization layer, a reflecting electrode, a pixel definition layer, an intermediate multilayer, and a semi-transparent electrode. The planarization layer may be substantially transparent and may be disposed on the inorganic multilayer. The reflecting electrode may be an individual layer disposed on the planarization layer. The pixel definition layer may be substantially transparent and may be disposed on the planarization layer to cover a side portion of the reflecting electrode. The intermediate multilayer may be disposed on the reflecting electrode. The semi-transparent electrode may be a common layer disposed on the intermediate multilayer. The pixel definition layer may have a sidewall extending along the outline of the light transmitting region in the at least the portion of the buffer region. The light blocking structure may include a semi-transparent member extending on the pixel definition layer to cover the sidewall of the pixel definition layer and being a single piece with the semi-transparent electrode.

The lower structure may further include an inorganic multilayer, a planarization layer, a reflecting electrode, a pixel definition layer, an intermediate multilayer, and a semi-transparent electrode. The planarization layer may be substantially transparent and may be disposed on the inorganic multilayer. The reflecting electrode may be an individual layer disposed on the planarization layer. The pixel definition layer may be substantially transparent and may be disposed on the planarization layer to cover a side portion of the reflecting electrode. The intermediate multilayer may be disposed on the reflecting electrode. The semi-transparent electrode may be a common layer and may be disposed on the intermediate multilayer. The planarization layer and the pixel definition layer may have a sidewall extending along the outline of the light transmitting region in the at least the portion of the buffer region. The light blocking structure may have a semi-transparent member extending on the planarization layer and the pixel definition layer to cover the sidewall and being a single piece with the semi-transparent electrode.

The light blocking structure may further include a reflection structure disposed on the inorganic multilayer. The sidewall may be in contact with an upper surface of the reflection structure so that the semi-transparent member may be in contact with the upper surface of the reflection structure.

The intermediate multilayer may have at least one intermediate common layer. A side portion of the semi-transparent member may be substantially closer to the light transmitting region than a side portion of the intermediate common layer.

The lower structure may further include an inorganic multilayer and a planarization layer. The planarization layer may be substantially transparent and may be disposed on the inorganic multilayer. The light blocking structure may include a first reflection structure disposed on the planarization layer.

The lower structure may further include a reflecting electrode, a pixel definition layer, an intermediate multilayer, and a semi-transparent electrode. The reflecting electrode may be an individual layer disposed on the planarization layer. The pixel definition layer may be substantially transparent and may be disposed on the planarization layer to cover a side portion of the reflecting electrode. The intermediate multilayer may be disposed on the reflecting electrode. The semi-transparent electrode may be a common layer disposed on the intermediate multilayer. The first reflection structure may be disposed on substantially the same layer as the reflecting electrode.

The planarization layer may have a first sidewall extending along the outline of the light transmitting region in the at least the portion of the buffer region.

The first reflection structure may extend on the planarization layer to cover the first sidewall.

The light blocking structure may further include a second reflection structure disposed on the inorganic multilayer. The first sidewall may be in contact with an upper surface of the second reflection structure so that the first reflection structure may be in contact with the upper surface of the second reflection structure.

The pixel definition layer may have a second sidewall extending along the outline of the light transmitting region in the at least the portion of the buffer region. The light blocking structure may further include a semi-transparent member extending on the pixel definition layer to cover the second sidewall and being a single piece with the semi-transparent electrode. The second sidewall may be in contact with an upper surface of the first reflection structure so that the semi-transparent member may be in contact with the upper surface of the first reflective layer.

The intermediate multilayer may include at least one intermediate common layer. A side portion of the semi-transparent member may be substantially closer to the light transmitting region than a side portion of the intermediate common layer.

The first reflection structure may have at least one hole.

The lower structure may include an inorganic multilayer structure, a planarization layer, a reflecting electrode, a pixel definition layer, an intermediate multilayer, and a semi-transparent electrode. The planarization layer may be substantially transparent and may be disposed on the inorganic multilayer structure. The reflecting electrode may be an individual layer disposed on the planarization layer. The pixel definition layer may be substantially transparent and may be disposed on the planarization layer to cover a side portion of the reflecting electrode. The intermediate multilayer may be disposed on the reflecting electrode. The semi-transparent electrode may be a common layer disposed on the intermediate multilayer. The inorganic multilayer structure may include at least one recess corresponding to the light transmitting region and filled with the planarization layer.

The light blocking structure may include a conductive material. The light blocking structure may not transmit an electrical signal.

Another electroluminescent device according to exemplary embodiments may include a lower structure and an encapsulation structure. The lower structure may include a substrate and an inorganic multilayer. The substrate may include glass or an organic polymer. The inorganic multilayer may be disposed on the substrate. The encapsulation structure may be disposed on the lower structure. The lower structure may include a display region and a light transmitting region. The display region may be defined inside an outline of the inorganic multilayer in a plan view. The light transmitting region may be defined inside the outline of the inorganic multilayer in a plan view and may have a non-through-hole structure having at least a portion surrounded by the display region. An upper portion of the inorganic multilayer may have at least one recess corresponding to the light transmitting region. The display region may be substantially opaque.

The inorganic multilayer may include an oxide layer and a nitride layer. The oxide layer may be partially removed by the at least one recess at the upper portion of the inorganic multilayer and the nitride layer may not be partially removed by the at least one recess at the upper portion of the inorganic multilayer.

The light transmitting region may include a plurality of substantially transparent display pixels.

Another electroluminescent device according to exemplary embodiments may include a lower structure and an encapsulation structure. The lower structure may include a glass substrate and an inorganic multilayer disposed on the glass substrate. The encapsulation structure may be disposed on the lower structure. The lower structure may include a display region defined inside an outline of the inorganic multilayer in a plan view and a light transmitting region defined inside an outline of the inorganic multilayer in a plan view and having a non-through-hole structure including at least a portion surrounded by the display region. The inorganic multilayer may include at least one hole corresponding to the light transmitting region. The display region may be substantially opaque.

The light transmitting region may include a plurality of substantially transparent display pixels.

According to the exemplary embodiments, the light blocking structure capable of preventing the light from entering into the light transmitting region having the non-through-hole structure may be provided. By forming the light transmitting region to have the non-through-hole structure, the damage due to irradiation of laser which may be employed to form a light transmitting region having a through-hole structure may not be generated. Further, the light transmitting region may have a portion patterned like a substantial "Ω" shape.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION OF THE EMBODIMENTS

Figure 1:
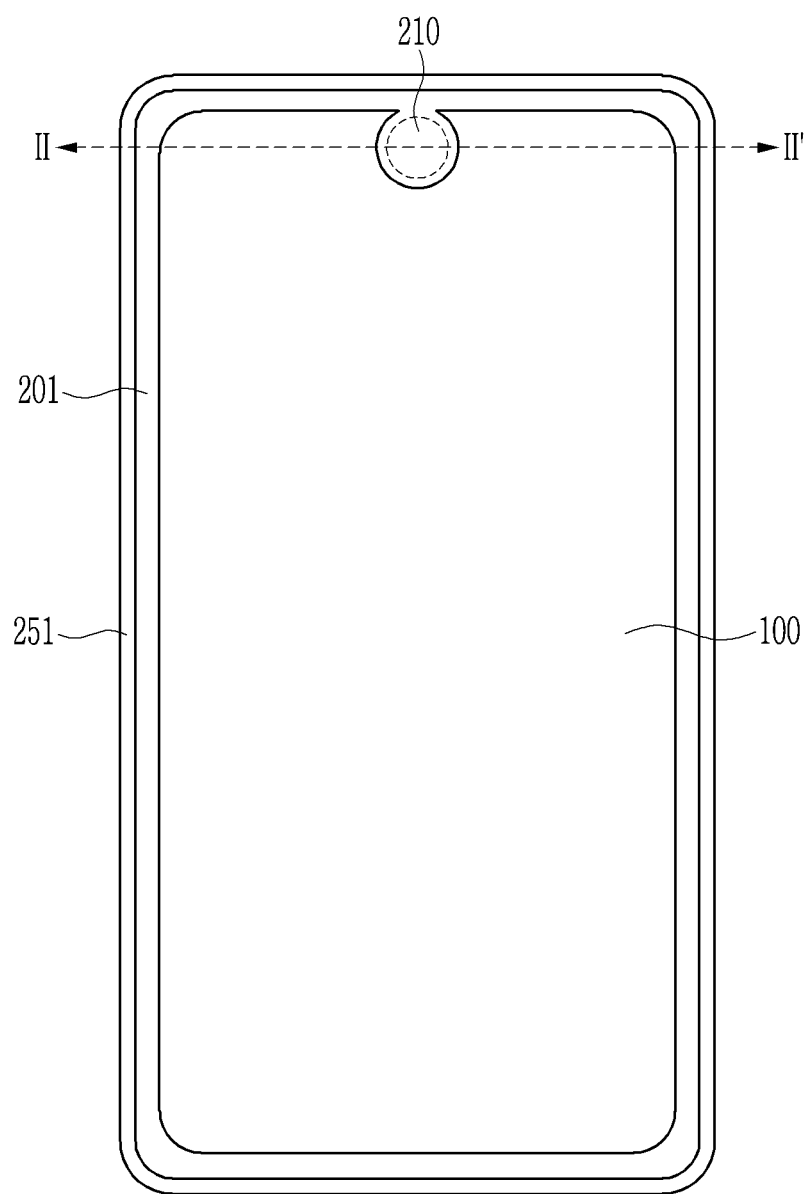
FIG. 1 is a plan view illustrating an electroluminescent device according to exemplary embodiments.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

An electroluminescent device according to exemplary embodiments will be described with reference to FIG. 1.

FIG. 1 is a plan view illustrating an electroluminescent device according to exemplary embodiments.

The electroluminescent device according to exemplary embodiments may include an external buffer region 201, a display region 100, a light transmitting region 210, and an inorganic-inorganic encapsulation contact region 251.

The display region 100 may include a plurality of pixels to display an image.

The light transmitting region 210 may have a light transmittance substantially higher than at least one selected from the group of the display region 100 and the external buffer region 201. At least one selected from the group of a light incident into at least one optical unit 10 disposed under the light transmitting region 210 and a light emitted from the optical unit 10 may pass through the light transmitting region 210. Examples of the optical unit 10 may include a camera, a flash, a sensor, etc.

In exemplary embodiments, the light transmitting region 210 may have a non-hole structure. Because a size of the light transmitting region 210 may be substantially larger than a pixel circuit zone PCZ in FIG. 13, the light transmitting region 210 may be substantially different from a light transmitting zone in the pixel for realizing a transparent display.

The external buffer region 201 may completely surround the display region 100 and the light transmitting region 210 in a plan view.

The inorganic-inorganic encapsulation contact region 251 may completely surround the external buffer region 201 in a plan view.

A portion of the external buffer region 201 may extend between the display region 100 and the light transmitting region 210 such that the display region 100 and the light transmitting region 210 may be separated from each other by the portion of the external buffer region 201.

The display region 100 may partially surround the light transmitting region 210 in a plan view.

Next, a cross-sectional view taken along a line in FIG. 1 is described.

Figure 2:
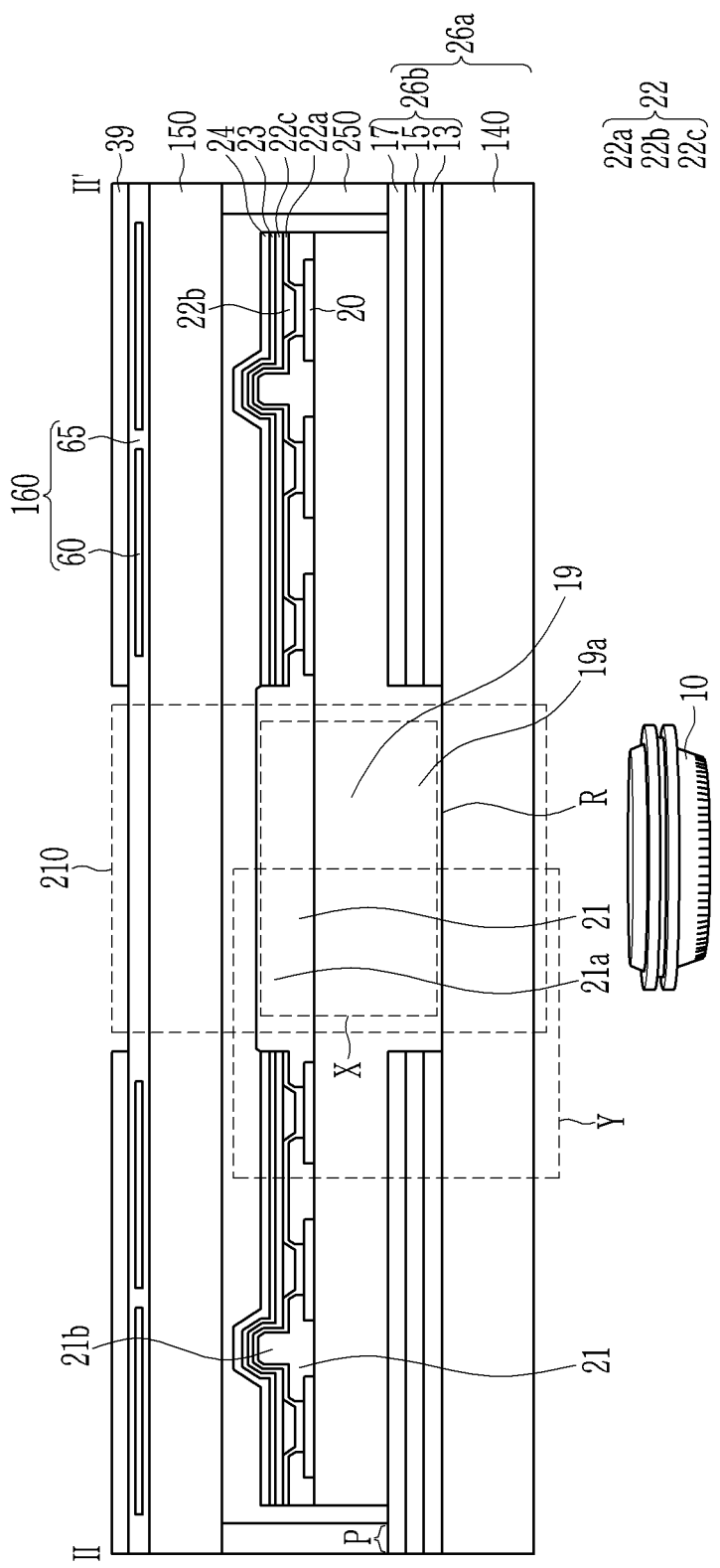
FIG. 2 is a cross-sectional view taken along a line II-II' in FIG. 1.

FIG. 2 is a cross-sectional view taken along the line II-II' in FIG. 1.

Referring to FIG. 2, the light transmitting region 210 may include a lower glass substrate 140, a planarization layer 19, a lower extending portion 19a of the planarization layer 19, a pixel definition layer 21, a first spacer 21a extending upward from the pixel definition layer 21, and an upper glass substrate 150. The lower extending portion 19a of the planarization layer 19 may extend downward from the planarization layer 19. The light transmitting region 210 may have no portion substantially shielding the light and, thus, the light transmitting region 210 may have a substantially high transparency. A space between the upper glass substrate 150 and the first spacer 21a may be empty. Alternatively, the space between the upper glass substrate 150 and the first spacer 21a may be filled with a filling structure having a substantially excellent light transmittance.

A touch sensor structure 160 may be disposed on the upper glass substrate 150. A polarization layer 39 may be disposed on the touch sensor structure 160. A portion of the touch sensor structure 160, the portion corresponding to the light transmitting region 210, may be removed. A portion of the polarization layer 39, the portion corresponding to the light transmitting region 210, may be removed. A transparent layer may be formed on the upper glass substrate 150 to correspond to the light transmitting region 210.

The planarization layer 19 may have the lower extending portion 19a corresponding to the light transmitting region 210. A portion of a preliminary inorganic multilayer, the portion corresponding to the light transmitting region 210, may be etched to form at least one hole and, then, the hole may be filled with the planarization layer 19 to form the lower extending portion 19a of the planarization layer 19. By etching the portion of the preliminary inorganic multilayer, the portion corresponding to the light transmitting region 210, the preliminary inorganic multilayer may become an inorganic multilayer 26b. According to FIG. 2, the inorganic multilayer 26b may include a first inorganic layer 13, a second inorganic layer 15, and a third inorganic layer 17. The inorganic multilayer 26b and the lower glass substrate 140 may be collectively referred to as an inorganic multilayer structure 26a.

The pixel definition layer 21 may include the first spacer 21a. The first spacer 21a may correspond to the light transmitting region 210. At least one selected from the group of an intermediate multilayer 22, a common upper electrode 23, and a common organic passivation layer 24 may be not formed on the first spacer 21a. The intermediate multilayer 22 may include a common hole transport layer (hereinafter, referred to as HTL) 22a, an individual emission layer 22b, and a common electron transport layer (hereinafter, referred to as ETL) 22c. According to exemplary embodiments, a layer having a high transparency among the common HTL 22a, the common ETL 22c, the common upper electrode 23, and the common organic passivation layer 24 may be disposed on the first spacer 21a. Hereinafter, at least one selected from the group of the common HTL 22a, the common ETL 22c, the common upper electrode 23, and the common organic passivation layer 24 may be referred to as a common layer.

The display region 100 may include a plurality of pixels, and one pixel may include a pixel circuit and a light emitting unit emitting light by using a current received from the pixel circuit. The light emitting units may be distinguished from each other by the pixel definition layer 21, and the pixel definition layer 21 in the display region 100 may include a second spacer 21b extending upward.

An inorganic frit 250 and the upper glass substrate 150 may serve as an upper encapsulation structure preventing external moisture from flowing into the organic emission layer. A contact region between the inorganic frit 250 and the third inorganic layer 17 may correspond to the inorganic-inorganic encapsulation contact region 251. In FIG. 2, an upper surface of the third inorganic layer 17 may have a region P in contact with the inorganic frit 250. The region P may correspond to an inorganic surface portion P of the inorganic multilayer structure 26a including the lower glass substrate 140 and the inorganic multilayer 26b. The inorganic multilayer structure 26a may include at least one lower inorganic encapsulation layer horizontally extending, e.g., under the entire upper surface of the inorganic multilayer structure 26a to vertically correspond to the entire upper surface of the inorganic multilayer structure 26a. The lower glass substrate 140 may correspond to the lower inorganic encapsulation layer. Only at least one inorganic layer may be disposed between the inorganic surface portion P and the lower inorganic encapsulation layer.

Figure 13:
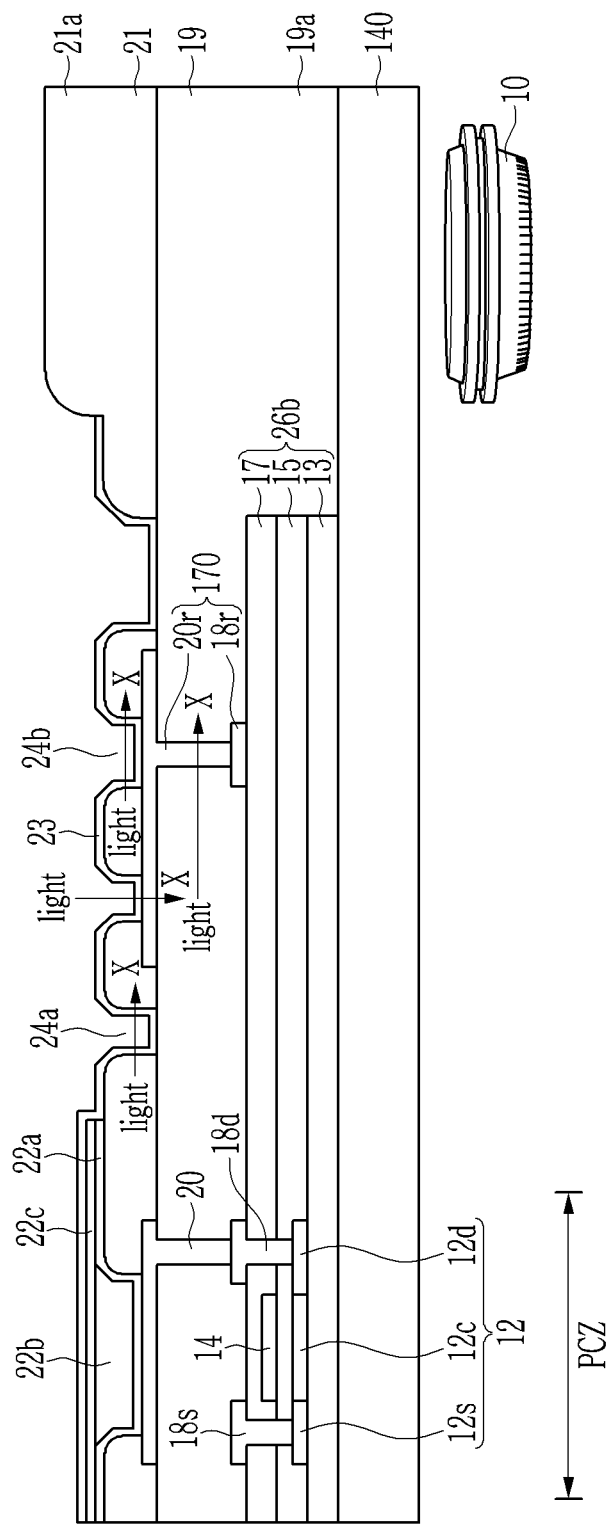
FIG. 13 and FIG. 14 are enlarged views illustrating a portion Y in FIG. 2.

In exemplary embodiments, the display region 100 may be substantially opaque. Because the light transmitting region 210 may be substantially larger than a pixel circuit zone PCZ which may be occupied by the pixel circuit to drive each pixel as illustrated in FIG. 13, the light transmitting region 210 may be substantially different from a light-transmitting zone formed in each pixel circuit zone PCZ for realizing the transparent display. As one example, the pixel circuit zone PCZ may have a substantial rectangle shape with approximate dimensions of about 25 micrometers in width and about 50 micrometers in length. As another example, the light transmitting region 210 may have a substantially circular shape having a diameter of about 3 mm. The first spacer 21a may have a larger area than the pixel circuit zone PCZ. Alternatively, the second spacer 21b may have a smaller area than the pixel circuit zone PCZ.

In exemplary embodiments, the light transmitting region 210 may have an area substantially larger than one color unit including pixels of different colors to achieve a white light. For example, the color unit may include a red pixel, a green pixel, and a blue pixel. In the light transmitting region 210 having a shape such as a substantial "L" shape, a substantial "U" shape, or a substantial "a" shape shown in FIG. 1, the area of the light transmitting region 210 may mean the area of a portion of the light transmitting region 210 substantially surrounded by the display region 100. That the display region 100 is "substantially opaque" or "opaque" means the display region 100 has substantially insufficient light transmittance to be used as a transparent display, but does not means that the display region 100 has a light transmittance of about zero percentage. The opaque display region 100 may include an opaque sub-display region having a first area and a transparent sub-display region having a second area that may be substantially smaller than the first area and may be completely or partially surrounded by the opaque sub-display region. Apart from the opaque display region 100, a plurality of transparent display pixels may be formed in the light transmitting region 210.

A meaning of a through-hole structure may include a case where a hole may be formed through both the lower substrate and the lower structure. A meaning of a non-through-hole structure may include a case where a hole may not be formed through at least one selected from the group of the lower substrate and the lower structure.

At least one selected from the group of the common HTL 22a, the common ETL 22c, the common upper electrode 23, and the common organic passivation layer 24 may be disposed on the second spacer 21b and may not be disposed on the first spacer 21a.

The lower electrode 20 which may be an individual layer may not overlap the light transmitting region 210. The lower electrode 20 may include a low light transmitting material or a reflective material.

A touch electrode structure 60 of the touch sensor structure 160 may not overlap the light transmitting region 210. The touch electrode structure 60 may include the low light transmitting material.

The polarization layer 39 may not overlap the light transmitting region 210. The polarization layer 39 may have a low light transmissivity characteristic. Instead of the polarization layer 39, a color filter CF having light-filtering regions R, G, and B and a light blocking member may be employed. Examples of the light blocking member may include a black matrix BM. When the color filter CF may be employed, the light-filtering regions R, G, and B and the black matrix BM may not overlap the light transmitting region 210.

In FIG. 2, a touch insulation structure 65 of the touch sensor structure 160 may overlap the light transmitting region 210. The touch insulation structure 65 may be partially removed not to overlap the light transmitting region 210.

In FIG. 2, the upper glass substrate 150 and the first spacer 21a may be disposed to be spaced apart from each other. As one alternative, the upper glass substrate 150 and the first spacer 21a may be in contact with each other. As another alternative, a filling structure having a substantially excellent light transmittance may be interposed between the upper glass substrate 150 and the first spacer 21a.

In FIG. 2, the common organic passivation layer 24 may not cover the first spacer 21a such that a light transmittance may be increased. The common organic passivation layer 24 may be in contact with the common upper electrode 23. The common organic passivation layer 24 may include a semiconductive or conductive organic material having a refractive index of over about 1.8. The common organic passivation layer 24 may serve to increase a light extraction and may serve to physically protect the common upper electrode 23. The common organic passivation layer 24 may be formed not by a plasma-enhanced chemical vapor deposition (hereinafter, referred to as PE-CVD) method but by an evaporation deposition process so as not to damage the common upper electrode 23.

According to exemplary embodiments, the common organic passivation layer 24 may be formed to cover the first spacer 21a. In this case, the common organic passivation layer 24 may physically protect the common upper electrode 23 more efficiently.

Figure 3:
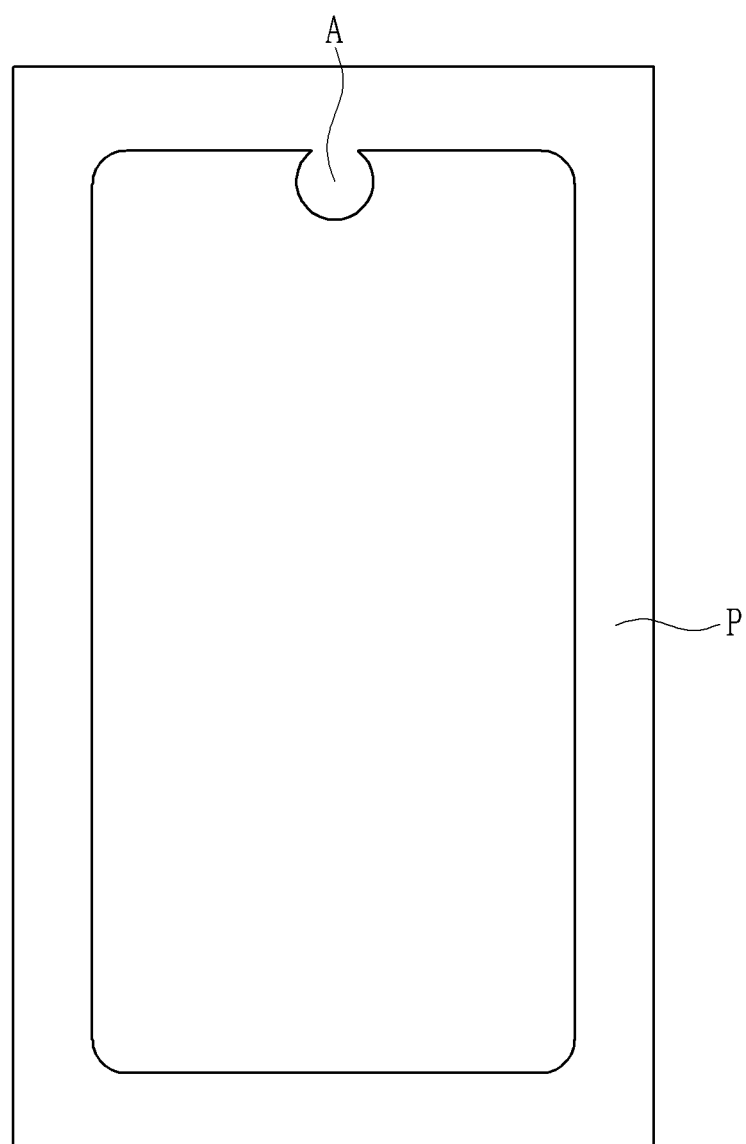
FIG. 3 and FIG. 4 are plan views illustrating open masks for evaporation deposition processes according to exemplary embodiments.
Figure 4:
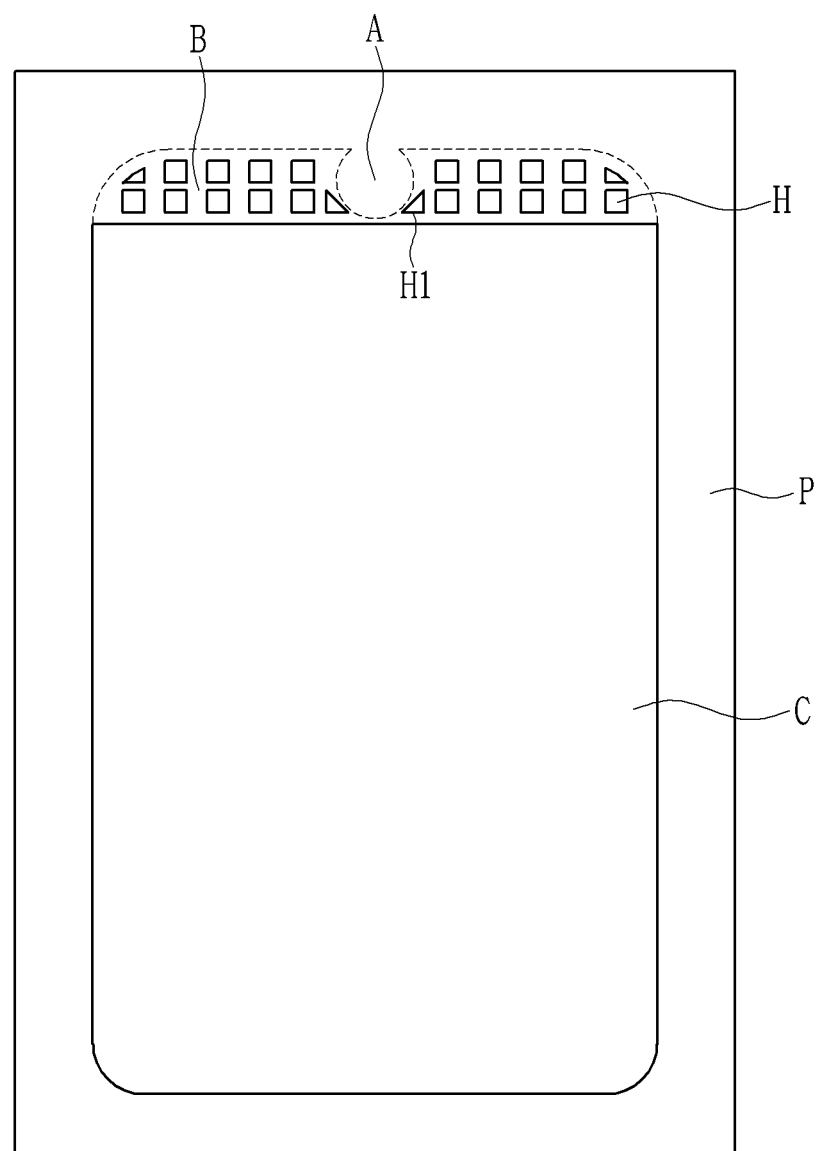

When the common organic passivation layer 24 may be formed not to cover the first spacer 21a, a mask in FIG. 3 and FIG. 4 may be used to form the common organic passivation layer 24. When the common organic passivation layer 24 may be formed to cover the first spacer 21a, an open mask without a portion A in FIG. 3 may be used to form the common organic passivation layer 24.

In FIG. 2, the first inorganic layer 13, the second inorganic layer 15, and the third inorganic layer 17 which may be included in the inorganic multilayer 26b may be all etched so that the inorganic multilayer structure 26a may have at least one recess R.

As one alternative, only the second and third inorganic layers 15 and 17 may be etched so that the inorganic multilayer structure 26a may have the recess R. As another alternative, only the third inorganic layer 17 may be etched so that the inorganic multilayer structure 26a may have the recess R. As still another alternative, none of the first, second, and third inorganic layers 13, 15, and 17 may be etched. However, if only the second and third inorganic layers 15 and 17 may be etched, only the third inorganic layer 17 may be etched, or none of the first, second, and third inorganic layers 13, 15, and 17 may be etched, it may be advantageous in view of light transmittance improvement that a structure lowering a light transmittance of the light transmitting region 210 may not be disposed directly on a portion of the inorganic multilayer 26b corresponding to the light transmitting region 210 or may not be disposed inside the portion of the inorganic multilayer 26b corresponding to the light transmitting region 210. Examples of the structure lowering the light transmittance of the light transmitting region 210 may include a reflective wiring below the first spacer 21a, a thin film transistor (hereinafter, referred to as TFT) below the first spacer 21a, a capacitor below the first spacer 21a, etc.

The pixel definition portion of the pixel definition layer 21 may have a height h1, and the first spacer 21a and the second spacer 21b may have a height h2 that may be substantially higher than the height h1. Here, to have the height h1 may mean that an uppermost surface may be formed at the height h1.

At least one selected from the group of the pixel definition layer 21 and the planarization layer 19 may include an organic material having a light transmittance of about 70 or more with respect to a wavelength of about 550 nm and a yellow color index less than about 95 at a thickness of 0.025 mm. For example, it may be preferable that the organic material may have the light transmittance of about 80% or more with respect to the wavelength of about 550 nm and the yellow color index less than about 20 at the thickness of about 0.025 mm.

According to exemplary embodiments, the pixel definition layer 21 may include a colored poly-imide (hereinafter, referred to as PI) or a transparent PI, and the planarization layer 19 may include an acryl-based resin. The colored PI may include a PI having a yellowish characteristic.

According to exemplary embodiments, the pixel definition layer 21 and the planarization layer 19 may include a colored PI or a transparent PI.

According to exemplary embodiments, both the pixel definition layer 21 and the planarization layer 19 may include the acryl-based resin.

According to exemplary embodiments, at least one selected from the group of the pixel definition layer 21 and the planarization layer 19 may include at least one selected from the group of a siloxane organic material and a silazane organic material.

According to exemplary embodiments, a portion X in FIG. 2 ranging from an upper surface of the first spacer 21a to a lower surface of the lower extending portion 19a of the planarization layer 19 may be removed and, then, a space formed by removing the portion X in FIG. 2 may be filled with a filling structure having a substantially good light transmittance. Examples of the filling structure may include a resin. The filling structure including the resin may have substantially the same height as the first spacer 21a such that the filling structure including the resin may perform the spacer function of the first spacer 21a.

When the inorganic multilayer 26b exists in the light transmitting region 210, a recess formed at a lower portion of the glass substrate 140 or a hole penetrating through the lower glass substrate 140 may be formed. An optical unit may be inserted into the recess or the hole.

When the hole may be formed through the lower glass substrate 140 and the inorganic multilayer 26b may not exist in the light transmitting region 210, the penetration of moisture may not be prevented. Accordingly, if the inorganic multilayer 26b does not exist in the light transmitting region 210, only the recess, i.e., not the hole, may be formed at the lower portion of the lower glass substrate 140 such that the optical unit may be inserted in to the recess.

The first inorganic layer 13 and the third inorganic layer 17 may include a silicon nitride. Examples of the silicon nitride may include SiNx, SiON, etc. The second inorganic layer 15 may include a silicon oxide. Examples of the silicon oxide may include SiO2.

Open masks according to exemplary embodiments will be described with reference to FIG. 3 and FIG. 4.

First, an open mask in FIG. 3 will be described.

FIG. 3 is a plan view illustrating an open mask for an evaporation deposition process to form at least one selected from the group of the common HTL 22a, the common ETL 22c, the common upper electrode 23, and the common organic passivation layer 24 in FIG. 2 according to exemplary embodiments.

The region A of the open mask in FIG. 3 may be adjacent to the first spacer 21a shown in FIG. 2 in the evaporation deposition process to form at least one selected from the group of the common HTL 22a, the common ETL 22c, the common upper electrode 23, and the common organic passivation layer 24 such that the at least one selected from the group of the common HTL 22a, the common ETL 22c, the common upper electrode 23, and the common organic passivation layer 24 may not be formed on the first spacer 21a.

Accordingly, the light transmittance deterioration of the light transmitting region 210, the light transmittance deterioration being generated by the at least one selected from the group of the common HTL 22a, the common ETL 22c, the common upper electrode 23, and the common organic passivation layer 24 formed on the first spacer 21a, may be prevented.

An open mask in FIG. 4 will be described.

FIG. 4 is a plan view illustrating an open mask used in an evaporation deposition process to form at least one selected from the group of the common HTL 22a, the common ETL 22c, the common upper electrode 23, and the common organic passivation layer 24 in FIG. 2 according to exemplary embodiments.

The region A of the open mask shown in FIG. 4 may be adjacent to the first spacer 21a shown in FIG. 2 in the evaporation deposition process to form at least one selected from the group of the common HTL 22a, the common ETL 22c, the common upper electrode 23, and the common organic passivation layer 24 such that the at least one selected from the group of the common HTL 22a, the common ETL 22c, the common upper electrode 23, and the common organic passivation layer 24 may not be formed on the first spacer 21a.

Accordingly, the light transmittance deterioration of the light transmitting region 210, the light transmittance deterioration being generated by the at least one selected from the group of the common HTL 22a, the common ETL 22c, the common upper electrode 23, and the common organic passivation layer 24 formed on the first spacer 21a, may be prevented.

The common layer may not be formed on the second spacer 21b overlapping the region B. The common layer may be formed on the second spacer 21b overlapping the hole H. The common layer may be formed on the second spacer 21b overlapping the region C. The second spacer 21b overlapping the region B may not be formed. The second spacer 21b overlapping the hole H may not be formed. The second spacer 21b overlapping the region B and the second spacer 21b overlapping the hole H may not be formed.

The region B having the plurality of holes H may extend to occupy the entire region C.

When the region A may be substantially circular, an ancillary hole H1 may be further formed near the region A so that the region A may have a substantially circular shape efficiently.

A shape of the hole H according to exemplary embodiments will be described with reference to FIGS. 5 to 9.

FIGS. 5 to 9 are enlarged views illustrating a shape of the hole H formed in the region B shown in FIG. 4.

The hole H used in the open mask like FIG. 4 may have various shapes as shown in FIGS. 5 to 9.

Figure 5:
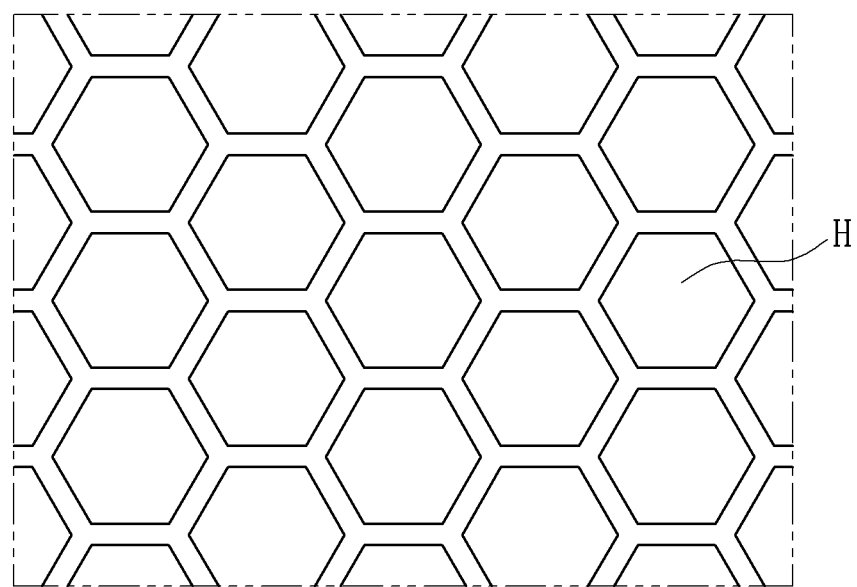
FIGS. 5 to 9 are enlarged views illustrating holes formed in a region B in FIG. 4.

FIG. 5 shows exemplary embodiments in which the shape of each hole H may be substantially hexagonal and may have an overall honeycomb shape.

Figure 6:
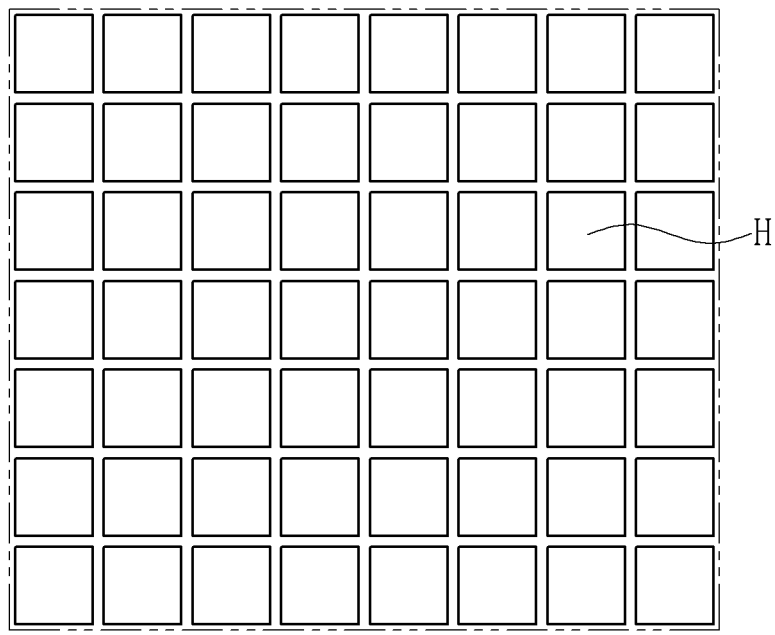
Figure 7:
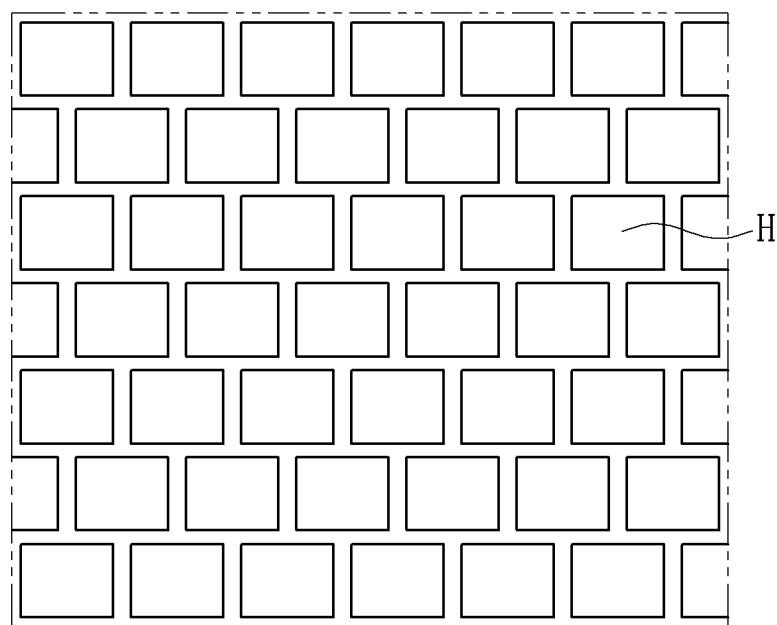

In FIG. 6, the shape of each hole H may be a substantial square. In FIG. 7, the shape of each hole H may be substantially rectangular. In FIG. 6, the holes H of the substantial square shape may be arranged in rows and columns. However, in FIG. 7, the holes H of the substantially rectangular shape may be arranged in rows and may be arranged to be crossed in the columns. For example, the holes H of the substantially rectangular shape may be arranged to be offset in the column direction and may be arranged not to be offset in the row direction.

Figure 8:
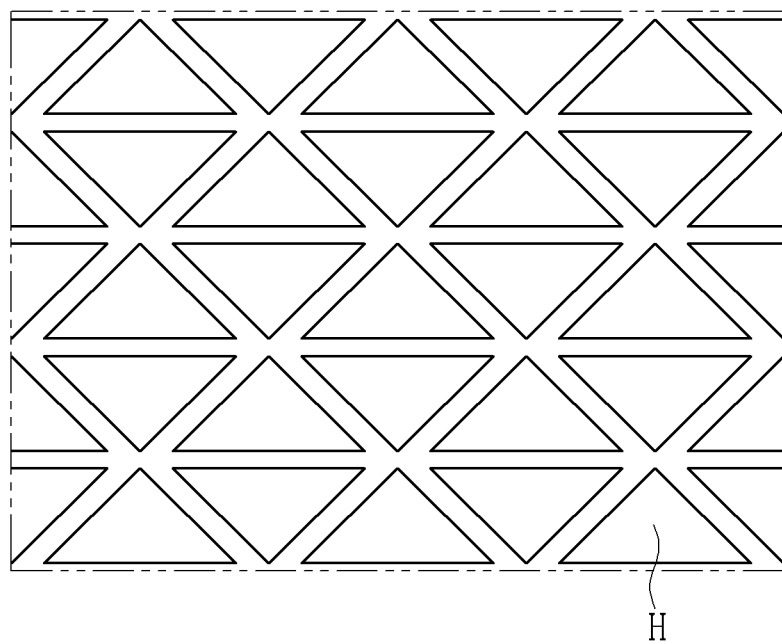
Figure 9:
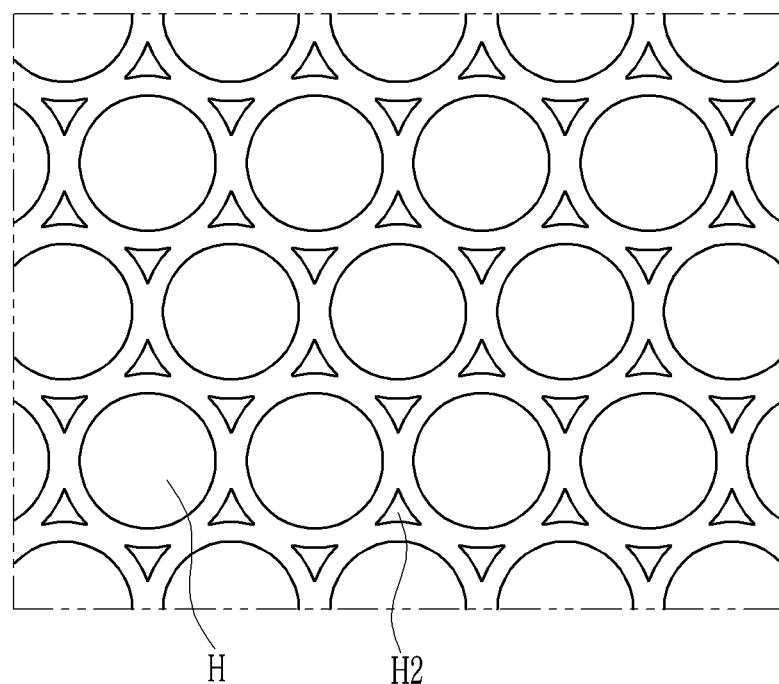

In exemplary embodiments illustrated in FIG. 8, the shape of each hole H may be triangular shape, while in exemplary embodiments illustrated in FIG. 9, the shape of each hole H may be substantially circular, and an ancillary hole H2 may be further formed.

As shown in the exemplary embodiments illustrated in FIGS. 5 to 8, the holes may have various shapes, such as hexagonal, quadrangular, triangular, etc., allowing the intervals between the holes H to be substantially constant.

When the shape of the hole may be substantially circular like in FIG. 9, in the space between the substantially circular shapes, a substantially non-circular ancillary holes H2 having a shape such as a triangle may be further formed.

The hole H may be formed to vertically correspond to the light emission zone of each pixel.

A size of the hole H may be sufficient enough to allow at least one selected from the group of the common HTL 22a, the common ETL 22c, and the common upper electrode 23 to become the common layer by using a shadow effect. The shadow effect may mean a phenomenon generated during the evaporation deposition of the organic material through a shadow mask having a hole. When the shadow effect may be generated, a deposited region of the organic material deposited through the hole may be substantially larger than an area of the hole and an outline of the hole may be disposed inside an outline the deposited region.

When determining a size of the hole H for forming at least one selected from the group of the common HTL 22a and the common ETL 22c, the hole H may have a size substantially smaller than a predetermined size allowing the at least one selected from the group of the common HTL 22a and the common ETL 22c to become a common layer. Even when the at least one of the common HTL 22a and the common ETL 22c may become a partially common layer or an individual layer, the electroluminescent device may operate normally. However, when determining a size of the hole H for forming the common upper electrode 23, the hole H may have a size no less than a predetermined size allowing the common upper electrode 23 to become a common layer. When the common upper electrode 23 may become a partially common layer or an individual layer, the electroluminescent device may not operate normally.

An electroluminescent device according to exemplary embodiments will be described with reference to FIG. 10 and FIG. 11.

Figure 10:
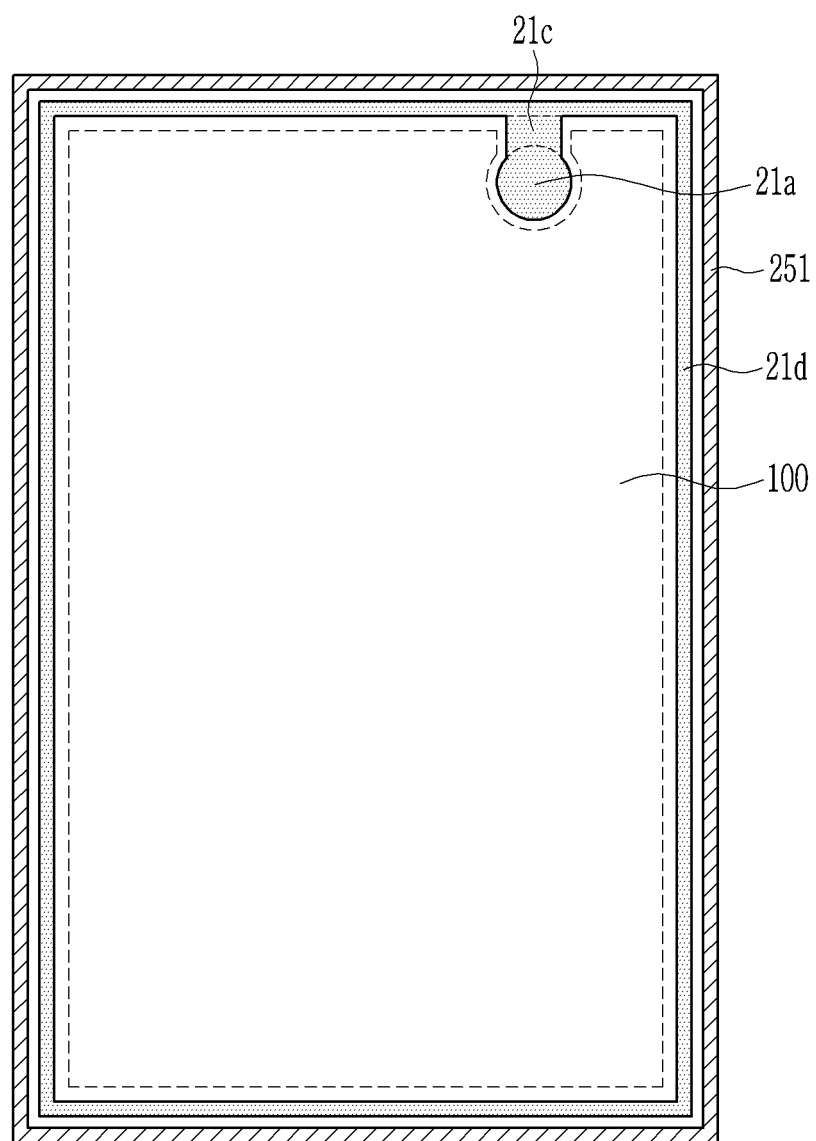
FIG. 10 and FIG. 11 are plan views illustrating electroluminescent devices according to exemplary embodiments.
Figure 11:
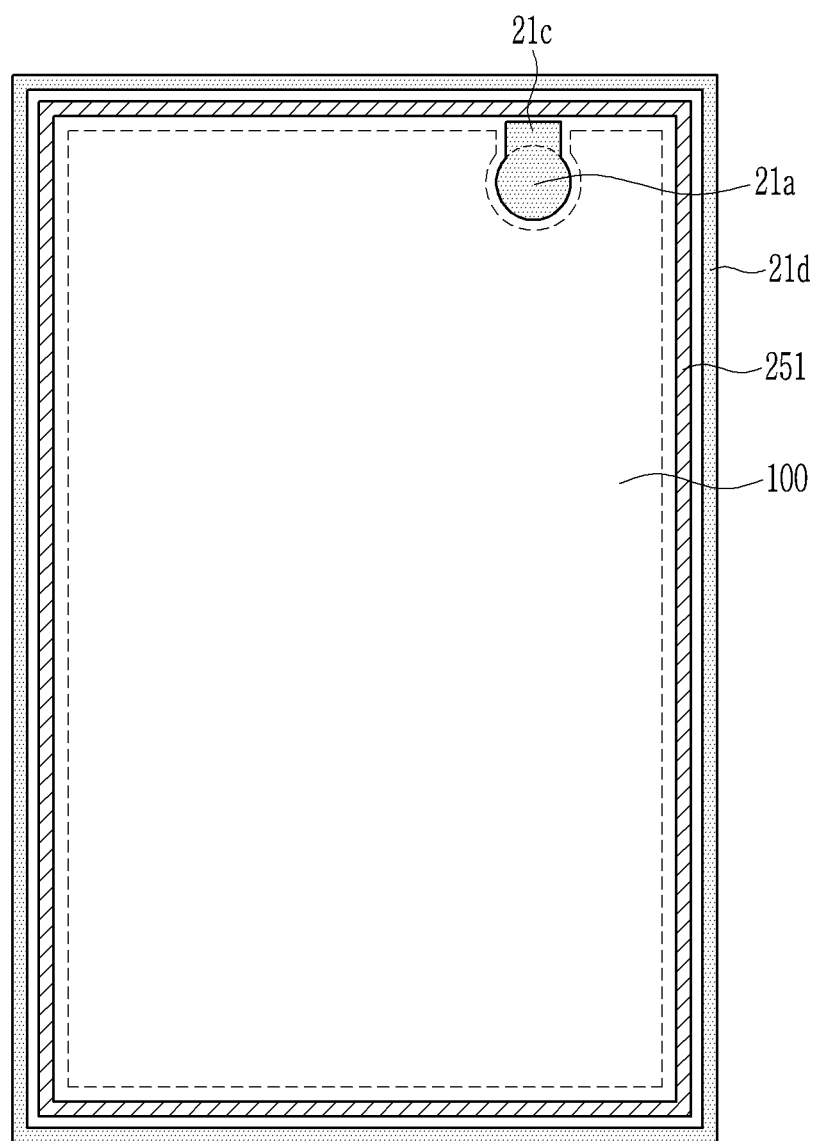

FIG. 10 and FIG. 11 are plan views illustrating electroluminescent devices each having a display region, a first spacer, a third spacer, a fourth spacer, and an inorganic-inorganic encapsulation contact region according to exemplary embodiments.

Referring to FIG. 10, a third spacer 21c may be connected between the first spacer 21a and a fourth spacer 21d. The first spacer 21a may be formed to correspond to the light transmitting region 210. The fourth spacer 21d may be disposed inside the inorganic-inorganic encapsulation contact region 251 and may be formed along the outline of the display region 100. The fourth spacer 21d may surround the display region 100 in a plan view. The fourth spacer 21d may be surrounded by the inorganic-inorganic encapsulation contact region 251 in a plan view. The third spacer 21c may extend from the fourth spacer 21d toward the light transmitting region 210 and may be connected with the first spacer 21a.

The third spacer 21c and the fourth spacer 21d may have substantially the same height as the first spacer 21a. The first spacer 21a, the third spacer 21c, and the fourth spacer 21d may be integrally formed as a single piece.

When comparing FIG. 10 to FIG. 3, the region A in FIG. 3 may correspond to the first spacer 21a such that the region A in FIG. 3 may be in contact with or may be adjacent to the first spacer 21a, the region P may correspond to the fourth spacer 21d such that the region P may be in contact with or may be adjacent to the fourth spacer 21d, and the region disposed between the region A and the region P may correspond to the third spacer 21c such that the region disposed between the region A and the region P may be in contact with or may be adjacent to the third spacer 21c.

Referring to FIG. 11, the first spacer 21a and the third spacer 21c may be connected. The inorganic-inorganic encapsulation contact region 251 may surround the display region 100 while passing between the third spacer 21c and the fourth spacer 21d in a plan view. The third spacer 21c and the fourth spacer 21d may have substantially the same height as the first spacer 21a. The first spacer 21a and the third spacer 21c may be integrally formed as a single piece. The fourth spacer 21d may have a shape such that the fourth spacer 21d may surround the inorganic-inorganic junction encapsulation region 251 in a plan view.

When comparing FIG. 11 to FIG. 3, the region A in FIG. 3 may correspond to the first spacer 21a such that the region A in FIG. 3 may be in contact with or may be adjacent to the first spacer 21a, the region P may correspond to the fourth spacer 21d, such that the region P may be in contact with or may be adjacent to the fourth spacer 21d, and the region disposed between the region A and the region P may correspond to the third spacer 21c such that the region disposed between the region A and the region P may be in contact with or may be adjacent to the third spacer 21c.

An individual mask according to exemplary embodiments will be described with reference to FIG. 12.

Figure 12:
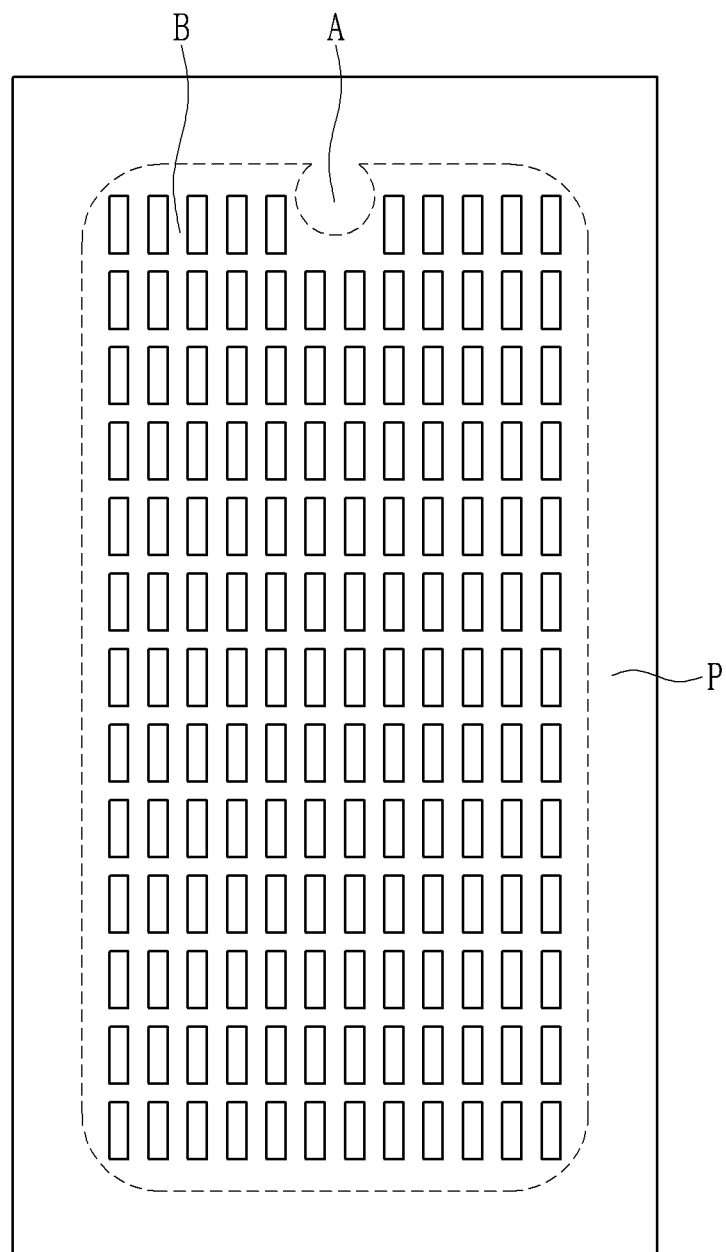
FIG. 12 is a plan view illustrating an individual mask for an evaporation deposition process according to exemplary embodiments.

FIG. 12 is a plan view illustrating an individual mask for an evaporation deposition process to form an individual emission layer in FIG. 2 according to exemplary embodiments.

Referring to FIG. 12, a region A of the individual mask may be adjacent to the first spacer 21a in FIG. 2 during the evaporation deposition process for forming the individual emission layer 22b such that the individual emission layer 22b may not be formed on the first spacer 21a.

Accordingly, a light transmittance deterioration of the light transmitting region 210, the light transmittance deterioration being generated by the individual emission layer 22b formed on the first spacer 21a, may be prevented. When the individual emission layer 22b may have a color and may include a transition metal, the individual emission layer 22b may exceedingly deteriorate a light transmittance. Therefore, it may be preferable that the individual emission layer 22b having the color and including the transition metal may not be formed in the light transmitting region 210.

The region B of the individual mask during the evaporation deposition process for forming the individual emission layer 22b may be disposed to be adjacent to the second spacer 21b in FIG. 2. Accordingly, the individual emission layer 22b may not be formed on the second spacer 21b.

A method for solving a light interference problem due to a light advancing from the individual emission layer 22b to the optical unit will be described with reference to FIG. 13.

FIG. 13 is an enlarged view illustrating a portion Y in FIG. 2 according to exemplary embodiments.

In FIG. 13, a pixel circuit zone PCZ may include a TFT. The TFT may include a semiconductor layer 12, a gate electrode 14, a source electrode 18s, and a drain electrode 18d. The semiconductor layer 12 may be disposed on the first inorganic layer 13. The semiconductor layer 12 may include a channel region 12c, a source region 12s, and a drain region 12d. The source and drain regions 12s and 12d may be disposed on opposite sides of the channel region 12c. The semiconductor layer 12 may be covered by the second inorganic layer 15. The gate electrode 14 may be disposed on the second inorganic layer 15 such that the gate electrode 14 may vertically correspond to the channel region 12c of the semiconductor layer 12. The gate electrode 14 may be covered by the third inorganic layer 17. The third inorganic layer 17 and the second inorganic layer 15 may have openings overlapping the source and drain regions 12s and 12d of the semiconductor layer 12. The source region 12s and the drain region 12d may be electrically connected to the source electrode 18s and the drain electrode 18d, respectively, through the openings. One pixel may include a plurality of TFTs, and one TFT among them may be electrically connected to a lower electrode 20. The lower electrode 20 may be connected to the drain electrode 18d of the TFT. The organic emission layer may be disposed on the lower electrode 20. The organic emission layer may include the common HTL 22a, the individual emission layer 22b, and the common ETL 22c. The common upper electrode 23 may be disposed on the organic emission layer. The individual emission layer 22b in the organic emission layer may emit a light for displaying an image by a current flowing between the lower electrode 20 and the common upper electrode 23.

A first reflection structure 18r may be formed by substantially the same process as the source and drain electrodes 18s and 18d. The first reflection structure 18r may be formed on substantially the same layer as the source and drain electrodes 18s and 18d. The source and drain electrodes 18s and 18d may have a triple layered structure including a reflective material. The triple layered structure may include a titanium (Ti) layer, an aluminum (Al) layer on the Ti layer, and a Ti layer on the Al layer.

A second reflection structure 20r may be formed by substantially the same process as the lower electrode 20. The second reflection structure 20r may be formed on substantially the same layer as the lower electrode 20. The lower electrode 20 may have a triple layered structure including a reflective material. The triple layered structure may include an indium tin oxide (ITO) layer, a silver (Ag) layer on the ITO layer, and an ITO layer on the Ag layer.

The first reflection structure 18r and the second reflection structure 20r may be in contact with each other. The first reflection structure 18r and the second reflection structure 20r may form the light blocking structure 170. An external light from the outside and an inner light from the individual emission layer 22b may advance into the optical unit 10 through the planarization layer 19. The light blocking structure 170 may block the external light and the inner light.

The second reflection structure 20r may have a plurality of holes. The holes may become a path for outgassing when the planarization layer 19 may be formed by using an organic material.

The first reflection structure 18r may be omitted according to exemplary embodiments. In this case, the second reflection structure 20r may be connected to the inorganic multilayer 26b.

The common upper electrode 23 may include magnesium (Mg) and silver (Ag). The common upper electrode 23 may have a sufficiently thin thickness such that the common upper electrode 23 may have a semi-transparent or transflective characteristic. Because the common upper electrode 23 may have the semi-transparent or transflective characteristic, the common upper electrode 23 may have a substantially lesser light blocking effect than a single transparent electrode. However, because the light blocking effect may be substantially smaller than the reflecting electrode, at least one first groove 24a may be formed in the pixel definition layer 21 over the planarization layer 19 or at least one second groove 24b may be formed on the second reflection structure 20r, thereby more effectively preventing light from flowing to the optical unit through the pixel definition layer 21.

The common upper electrode 23 may be formed on a left sidewall, a bottom and a right sidewall of the first groove 24a. The light passing through the first groove 24a from a left side of the first groove 24a to a right side of the first groove 24a may be reduced two times by a portion of the common upper electrode 23 on the left sidewall of the first groove 24a and a portion of the common upper electrode 23 on the right sidewall of the first groove 24a. Therefore, the light passing through the first groove 24a from the left side of the first groove 24a to the right side of the first groove 24a may be effectively blocked even though the common upper electrode 23 may have the semi-transparent or transflective characteristic. Similarly, the common upper electrode 23 may be formed on a left sidewall, a bottom and a right sidewall of the second groove 24b. The light passing through the second groove 24b from a left side of the second groove 24b to a right side of the second groove 24b may be reduced two times by a portion of the common upper electrode 23 on the left sidewall of the second groove 24b and a portion of the common upper electrode 23 on the right sidewall of the second groove 24b. Therefore, the light passing through the second groove 24b from the left side of the second groove 24b to the right side of the second groove 24b may be effectively blocked even though the common upper electrode 23 may have the semi-transparent or transflective characteristic. Furthermore, when the pixel definition layer 21 may have the first and second grooves 24a and 24b, the light may be more efficiently blocked.

The first reflection structure 18r, the second reflection structure 20r, the first groove 24a, and the second groove 24b may be formed to extend along the circumference of the light transmitting region 210 between the display region 100 and the light transmitting region 210 in a plan view, thereby preventing the light being transmitted to the light transmitting region 210.

The common upper electrode 23 may be in contact with the second reflection structure 20r such that the second reflection structure 20r may perform a function of ancillary wiring supplying power to the common upper electrode 23. Alternatively, the second reflection structure 20r may be in an electrically floating state.

In order for the common upper electrode 23 and the second reflection structure 20r to contact each other, the region A shown in FIG. 3 of the mask for forming the common upper electrode 23 may be substantially smaller than the region A shown in FIG. 3 of the mask for forming the common ETL 22c and the common HTL 22a.

In FIG. 13, the common organic passivation layer 24 may be omitted. However, the common organic passivation layer 24 may be formed on the common upper electrode 23. Also, according to exemplary embodiments, the common inorganic passivation layer (not shown) may be further formed on the common organic passivation layer 24.

At least one light blocking structure 170 may be included in the panel to reinforce the light blocking.

In another exemplary embodiment, to reduce the light interference of the light from the individual emission layer 22b into the optical unit 10, the distance between the individual emission layer 22b and the light transmitting region 210 may increase. In this case, the light inflow to the optical unit may be reduced.

In another exemplary embodiment, the light inflow may be reduced by forming the pixel near the first spacer 21a in a normally black mode, or by allowing the pixel near the first spacer 21a to display the black when the optical unit 10 may be used.

In FIG. 13, the position of the first groove 24a may be substantially farther away from the light transmitting region 210 than the second groove 24b. However, unlike in FIG. 13, the positions of the first groove 24a and the second groove 24b may be switched. One first groove 24a may be formed inner than the second groove 24*b* and another first groove 24*a* may be formed outer than the second groove 24*b*.

A variation of the exemplary embodiment in FIG. 13 will be described with reference to FIG. 14.

Figure 14:
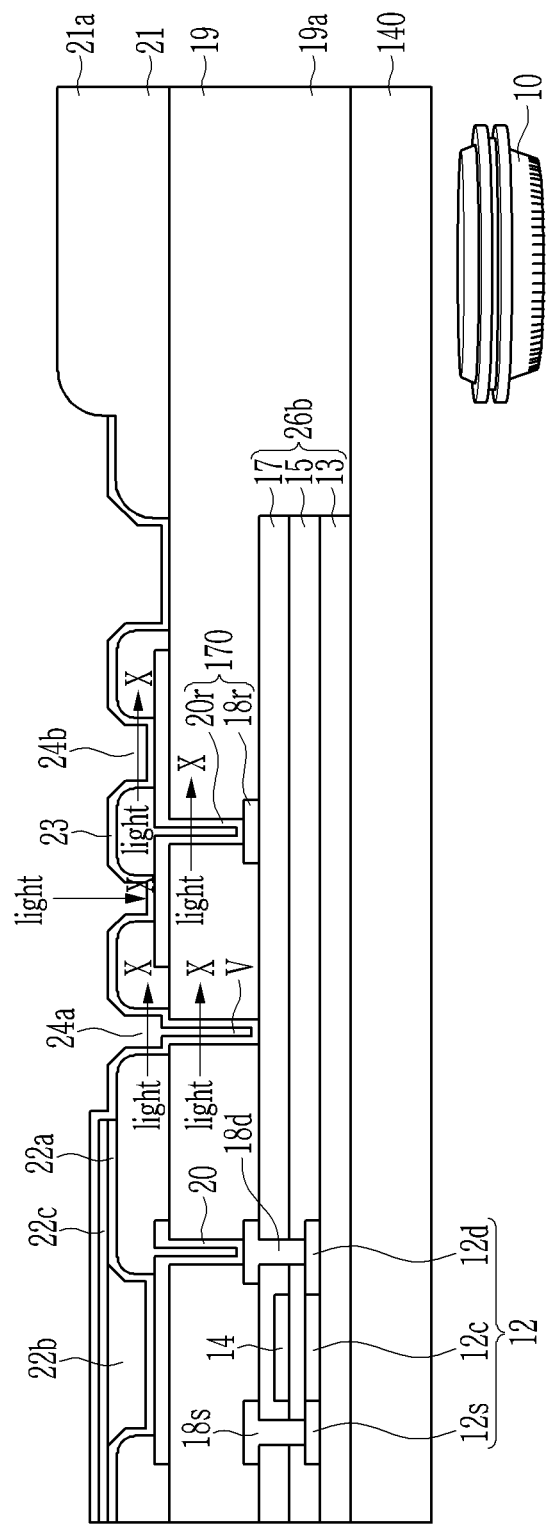

FIG. 14 is an enlarged view illustrating the portion Y in FIG. 2 according to exemplary embodiments. The exemplary embodiments in FIG. 14 and the exemplary embodiments in FIG. 13 may be mutually cooperative and complement each other. The exemplary embodiment in FIG. 13 and the exemplary embodiments in FIG. 14 may be not mutually exclusive.

The first groove 24*a* may extend to the planarization layer 19 to block the light transmitted to the optical unit 10 through the planarization layer 19. A void may be formed in the first groove 24*a* so that an effect of blocking the light by using the common upper electrode 23 may be obtained at least two times.

Although not shown in FIG. 14, the second reflection structure 20*r* may be exposed from the bottom of the first groove 24*a*, and the second reflection structure 20*r* may be connected to the common upper electrode 23. The power transmitted to the second reflection structure 20*r* may be provided to the common upper electrode 23, thereby the second reflection structure 20*r* may also perform a function of an auxiliary electrode reducing a voltage drop, i.e., IR drop, phenomenon of the common upper electrode 23.

A void V may be formed inside the second reflection structure 20*r*. The void V may be filled with the pixel definition layer 21. The light may be blocked at least two times by the second reflection structure 20*r* having the void V filled with the pixel definition layer 21 such that the light may not transmitted to the light transmitting region 210.

Like the second reflection structure 20*r* shown in FIG. 13, the void V may also be formed inside the second reflection structure 20*r* shown in FIG. 14. In this case, the second reflection structure 20*r*, the common upper electrode 23, the common upper electrode 23, and the second reflection structure 20*r* may effectively perform light blocking functions, respectively, such that the light in the planarization layer 19 may not flow from the planarization layer 19 to the optical unit 10.

An electroluminescent device according to exemplary embodiments will be described with reference to FIG. 15.

Figure 15:
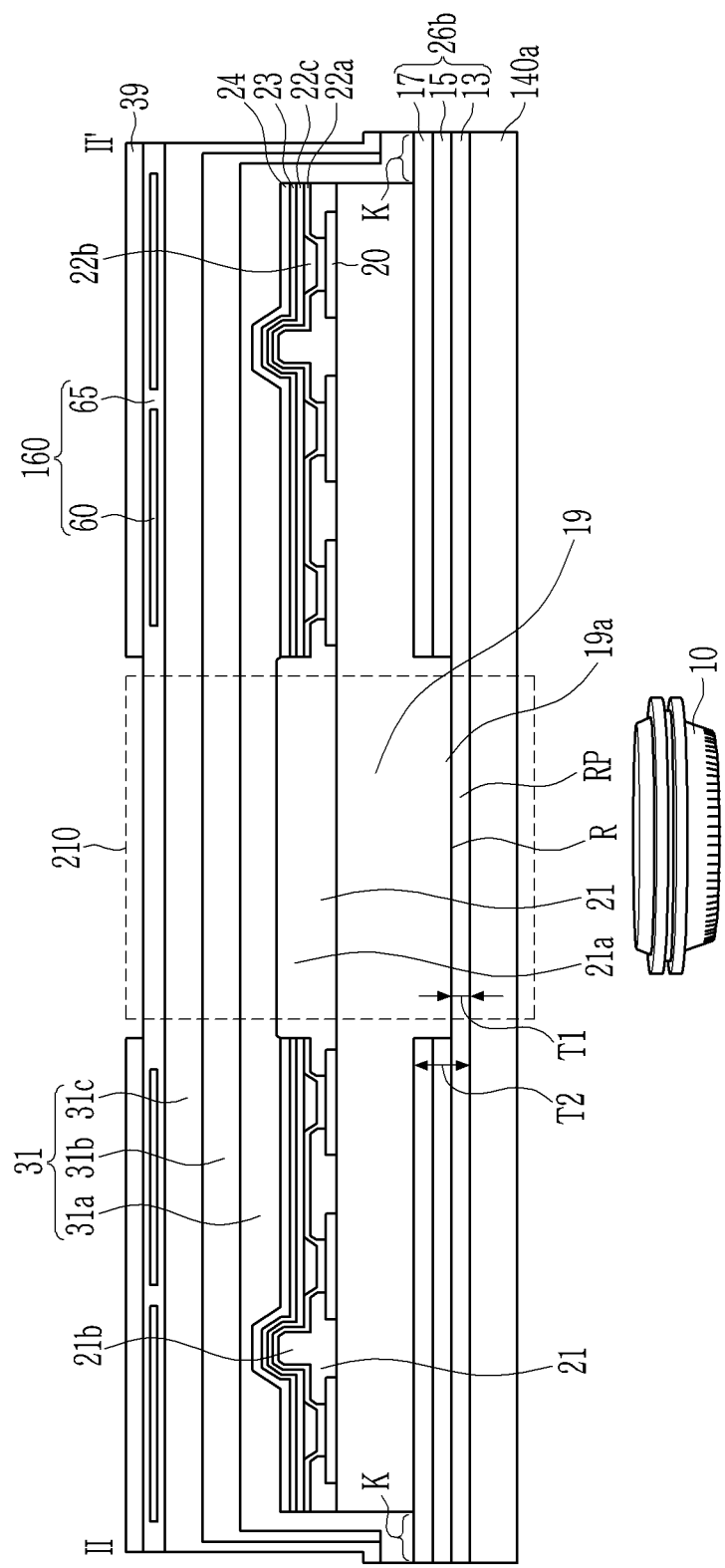
FIG. 15 is a cross-sectional view illustrating an electroluminescent device according to exemplary embodiments.

FIG. 15 is a cross-sectional view illustrating an electroluminescent device according to exemplary embodiments.

In FIG. 15, a multi-layered encapsulation layer 31 may be employed instead of the inorganic frit 250 and the upper glass substrate 150 in FIG. 2. A lower transparent organic polymer substrate 140*a* may be employed instead of the lower glass substrate 140. Unlike the upper glass substrate 150 and the lower glass substrate 140 in FIG. 2, the lower transparent organic polymer substrate 140*a* in FIG. 15 may include a plastic material having a flexible characteristic such as a polyimide (PI). Here, the multi-layered encapsulation layer 31 may include first and second encapsulation inorganic layers 31*a* and 31*c*, and may include one organic layer 31*b*. The one organic layer 31*b* may be disposed between the first encapsulation inorganic layer 31*a* and the second inorganic encapsulation layer 31*c*.

In the manufacturing process, a sacrificial glass substrate (not shown) may be disposed under the lower transparent organic polymer substrate 140*a*, and the sacrificial glass substrate may be removed in the final step such that the lower transparent organic polymer substrate 140*a* may be located at the bottom.

The light transmitting region 210 according to FIG. 15 may include the lower transparent organic polymer substrate 140*a*, the lower extending portion 19*a* of the planarization layer 19, the planarization layer 19, the pixel definition layer 21, the first spacer 21*a*, and the multi-layered encapsulation layer 31. Therefore, the light transmitting region 210 may have the characteristic of an increased transparency.

In FIG. 15, a region where an inorganic upper surface of the third inorganic layer 17 disposed at the uppermost portion of the inorganic multilayer 26*b* and an inorganic lower surface of the first encapsulation inorganic layer 31*a* disposed at the lowest portion of the multi-layered encapsulation layer 31 may be in contact with each other may correspond to the inorganic-inorganic encapsulation contact region 251 which may have a function substantially the same as the inorganic frit 250 shown in FIG. 2. The inorganic upper surface of the third inorganic layer 17 may be disposed not to be substantially lower than a plane on which a lower surface of the lower extending portion 19*a* of planarization layer 19 may be disposed.

In FIG. 15, if the first inorganic layer 13, the second inorganic layer 15, and the third inorganic layer 17 may be all etched in the light transmitting region 210, the lower transparent organic polymer substrate 140*a* which may include an organic material not an inorganic material may be exposed. Accordingly, the moisture and oxygen may be supplied directly to an electroluminescent unit by passing through the lower transparent organic polymer substrate 140*a*. Therefore, it may be preferred that the first inorganic layer 13, the second inorganic layer 15, and the third inorganic layer 17 may not all be etched in the light transmitting region 210. As one example, only the third inorganic layer 17 may be etched in the light transmitting region 210. As another example, only the second inorganic layer 15 and the third inorganic layer 17 may be etched in the light transmitting region 210. As still another example, none of the first inorganic layer 13, the second inorganic layer 15, and the third inorganic layer 17 may be etched in the light transmitting region 210.

According to exemplary embodiments, when at least one recess R may be formed in the inorganic multilayer 26*b* including the first inorganic layer 13, the second inorganic layer 15, and the third inorganic layer 17, a thickness T2 of a portion of the inorganic multilayer 26*b* where the recess R may not be formed may be substantially greater than a thickness T1 of a portion of the inorganic multilayer 26*b* where the recess R may be formed.

According to exemplary embodiments, a space into which the optical unit 10 may be inserted may be formed by forming a recess at a lower portion of the lower transparent organic polymer substrate 140*a* or by forming a hole through the lower transparent organic polymer substrate 140*a*.

The first inorganic layer 13 and the third inorganic layer 17 may include a silicon nitride. The second inorganic layer 15 may include a silicon oxide. In this case, a portion of the inorganic multilayer 26*b* where the recess R may be formed may have a remaining part RP only including an inorganic layer of a silicon nitride. When the portion of the inorganic multilayer 26*b* where the recess R may be formed may have the remaining part RP only having an inorganic layer of a silicon oxide, the inorganic multilayer 26*b* may not efficiently prevent a water penetration. This may be because the silicon oxide may have a weaker function of water penetration prevention than the silicon nitride. Particularly, as in FIG. 15, when the lower transparent organic polymer substrate 140*a* having a substantially poor water penetration prevention characteristic may be located under the inorganic multilayer 26*b*, it may be required that the portion of the inorganic multilayer 26*b* where the recess R may be formed may have the remaining part RP having the inorganic layer of the silicon nitride which may have a substantially good water penetration prevention characteristic.

Although not shown in FIG. 15, in order to form the recess R, the second inorganic layer 15 including the silicon oxide may be removed and the first and third inorganic layer 13 and 17 including the silicon nitride may not be removed. In this case, the first inorganic layer 13 and the third inorganic layer 17 may be in direct contact with each other near the recess R such that the encapsulation function may be improved and the Bragg mirror phenomenon generated when several layers having substantially different refractive indexes may be deposited may be advantageously reduced.

An electroluminescent device including a light transmitting region 210 having a different shape will be described with reference to FIG. 16.

Figure 16:
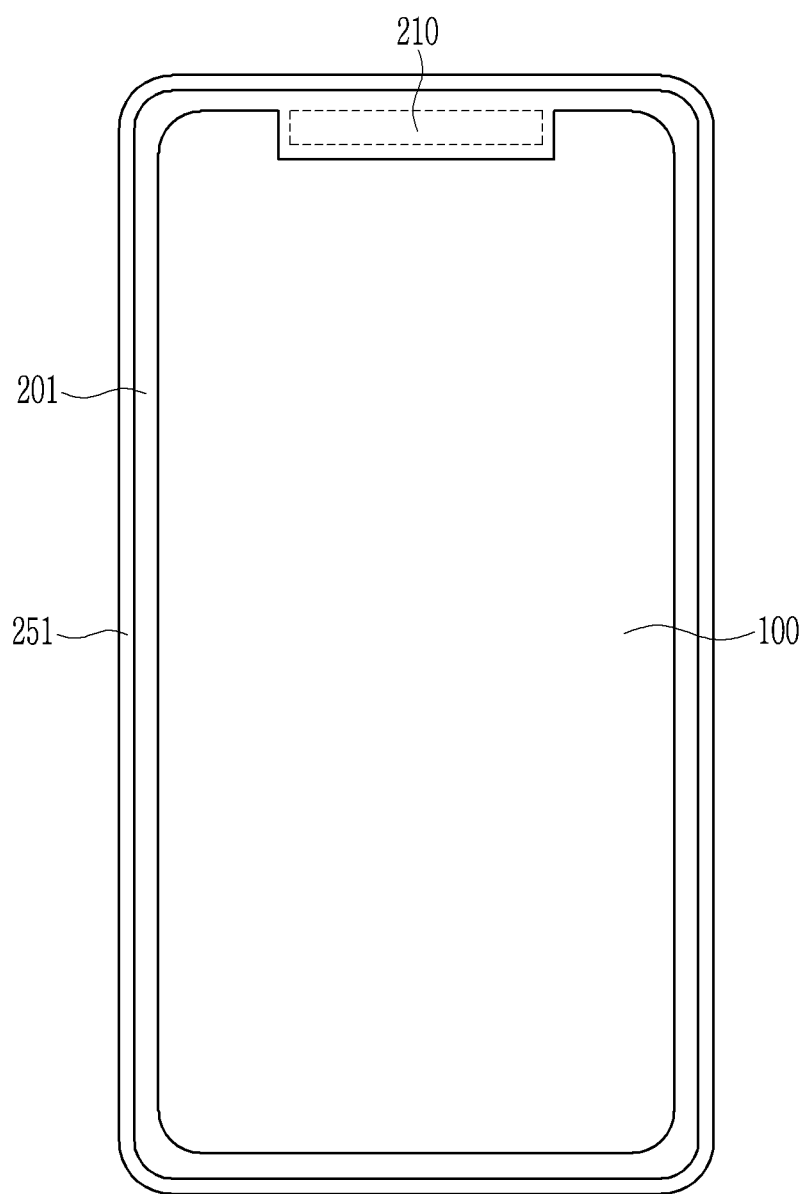
FIG. 16 and FIG. 17 are plan views illustrating panels according to exemplary embodiments.

FIG. 16 is a plan view illustrating an electroluminescent device according to exemplary embodiments.

The electroluminescent device shown in FIG. 16 may be substantially the same as the electroluminescent device shown in FIG. 1, except for the light transmitting region 210 having a sufficient size such that a plurality of the optical units 10 shown in FIG. 2 may be accommodated.

At least two optical units 10 may be disposed on the rear surface in the light transmitting region 210 in FIG. 16. The electroluminescent device may further include a light blocking structure (not shown) disposed in a region between the two optical units 10. In this case, the light blocking structure may have substantially the same structure as the light blocking structure 170 shown in FIG. 13 or FIG. 14.

An electroluminescent device including a light transmitting region 210 having a different position will be described with reference to FIG. 17.

Figure 17:
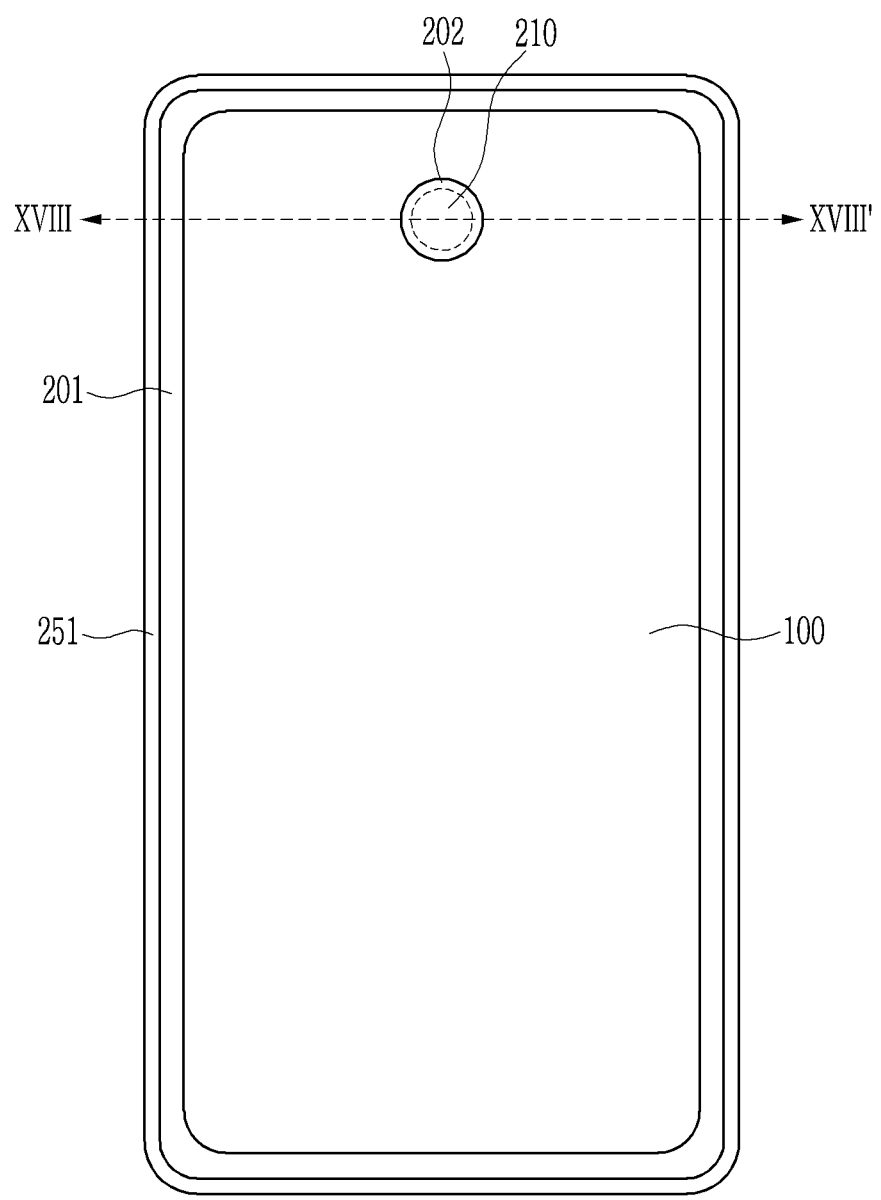

FIG. 17 is a plan view illustrating an electroluminescent device according to exemplary embodiments.

Referring to FIG. 17, an inner buffer region 202 may be further included. The inner buffer region 202 may completely surround the light transmitting region 210 in a plan view. The inner buffer region 202 may be completely surrounded by the display region 100 in a plan view. The external buffer region 201 may completely surround the display region 100. The inorganic-inorganic encapsulation contact region 251 may completely surround the external buffer region 201 in a plan view.

Exemplary embodiments will be described in detail with reference to a cross-sectional view taken along a line XVII-XVII' in FIG. 17.

Figure 18:
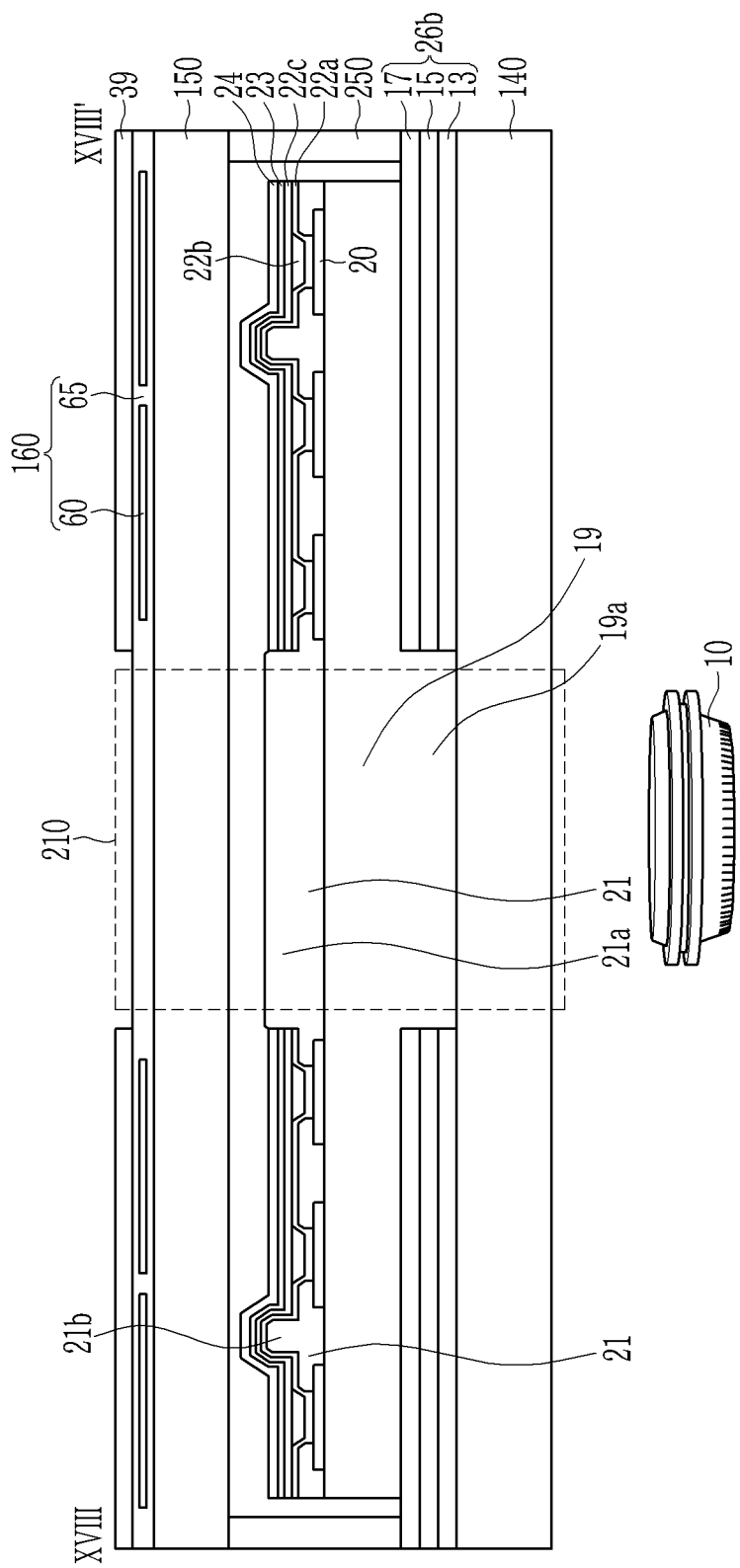
FIG. 18 is a cross-sectional view taken along a line XVII-XVII' in FIG. 17.

FIG. 18 is a cross-sectional view taken along the line XVII-XVII' in FIG. 17.

When explaining FIG. 18, the description of substantially the same parts as described in FIG. 2 will be omitted.

At least one hole corresponding to the light transmitting region 210 may be formed through the inorganic multilayer 26*b*. Because the lower glass substrate 140 may include an inorganic material such as a glass, the lower glass substrate 140 may have an excellent encapsulation characteristic unlike the lower transparent organic polymer substrate 140*a* in FIG. 15 which may include the organic material. Therefore, the hole corresponding to the light transmitting region 210 may be formed through the inorganic multilayer 26*b*.

In exemplary embodiments, the first inorganic layer 13 may not be removed and the second and third inorganic layers 15 and 17 may be removed in the light transmitting region 210 such that the inorganic multilayer 26*b* may have at least one recess corresponding to the light transmitting region 210. In detail, when the inorganic multilayer 26*b* may have a first thickness in the light transmitting region 210, the inorganic multilayer 26*b* may have a second thickness substantially thicker than the first thickness in a region except for the light transmitting region 210.

An open mask used in the exemplary embodiment in FIG. 18 will be described with reference to FIGS. 19 to 21.

Figure 19:
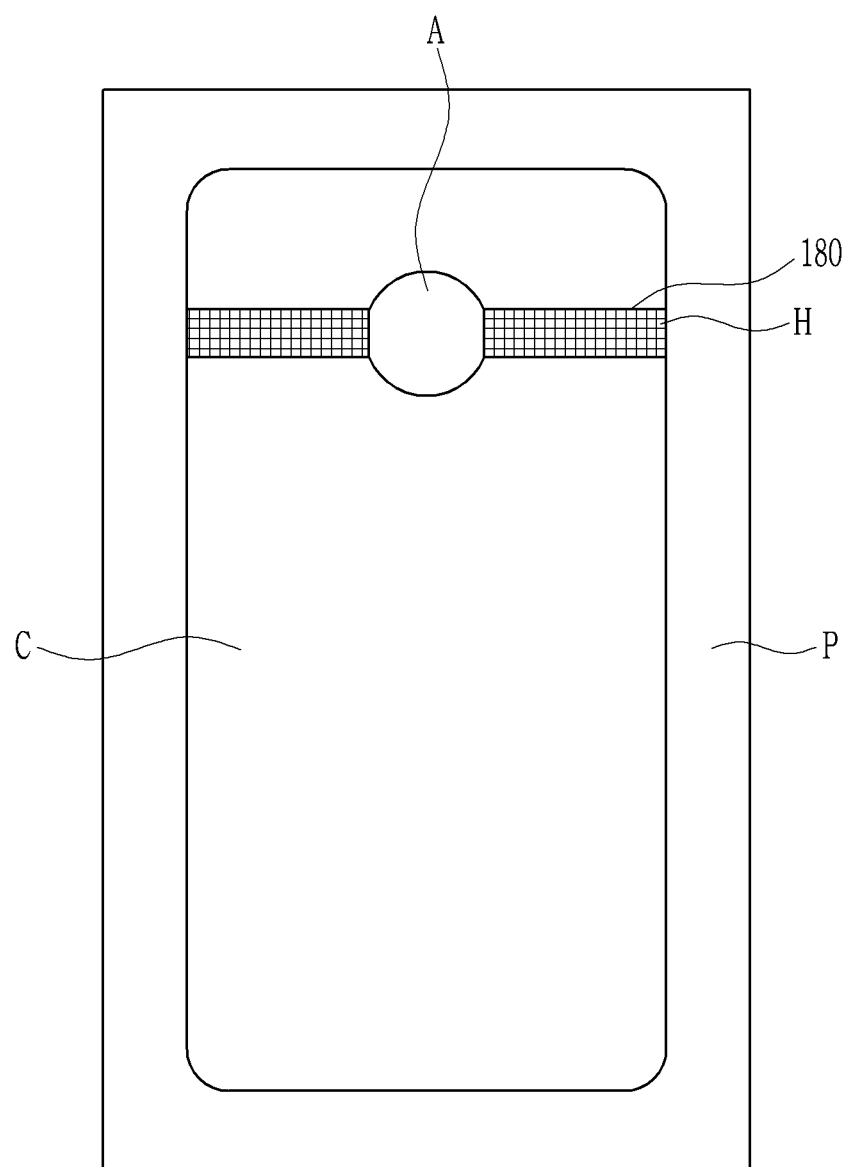
FIGS. 19 to 21 are plan views showing open masks for evaporation deposition processes according to exemplary embodiments.

FIG. 19 is a plan view illustrating an open mask for an evaporation deposition process used to form at least one selected from the group of the common HTL 22*a*, the common ETL 22*c*, the common upper electrode 23, and the common organic passivation layer 24 in FIG. 18 according to exemplary embodiments.

In the evaporation deposition process for forming the at least one selected from the group of the common HTL 22*a*, the common ETL 22*c*, the common upper electrode 23, and the common organic passivation layer 24, a region A of the open mask may be adjacent to the first spacer 21*a* in FIG. 18 such that the at least one selected from the group of the common HTL 22*a*, the common ETL 22*c*, the common upper electrode 23, and the common organic passivation layer 24 may not be formed on the first spacer 21*a*. Accordingly, a light transmittance deterioration of the light transmitting region 210, the light transmittance deterioration being generated when the at least one selected from the group of the common HTL 22*a*, the common ETL 22*c*, the common upper electrode 23, and the common organic passivation layer 24*e* may be formed on the first spacer 21*a*, may be prevented.

In exemplary embodiments in FIG. 19, a connecting bar 180 may be provided. A plurality of holes H may be formed in the connecting bar 180. A deposition material entering through the holes H may be somewhat spread by the shadow effect on a portion covered by the connecting bar 180 such that the at least one selected from the group of the common HTL 22*a*, the common ETL 22*c*, the common upper electrode 23, and the common organic passivation layer 24 may be commonly deposited.

The at least one selected from the group of the common HTL 22*a*, the common ETL 22*c*, the common upper electrode 23, and the common organic passivation layer 24 may not be formed on the second spacer 21*b* overlapping the connecting bar 180. The at least one selected from the group of the common HTL 22*a*, the common ETL 22*c*, the common upper electrode 23, and the common organic passivation layer 24 may be formed on the second spacer 21*b* overlapping the holes H. The at least one selected from the group of the common HTL 22*a*, the common ETL 22*c*, the common upper electrode 23, and the common organic passivation layer 24 may be formed on the second spacer 21*b* overlapping the region C.

In FIG. 19, the connecting bar 180 may be connected to a region A in an X-axis direction. As one alternative, the connecting bar 180 may be connected to the region A in a Y-axis direction substantially perpendicular to the X-axis direction. As another alternative, the connecting bar 180 may be connected to the region A in the X-axis direction and the connecting bar 180 may be also connected to the region A in the Y-axis direction.

An open mask according to exemplary embodiments will be described with reference to FIG. 20.

Figure 20:
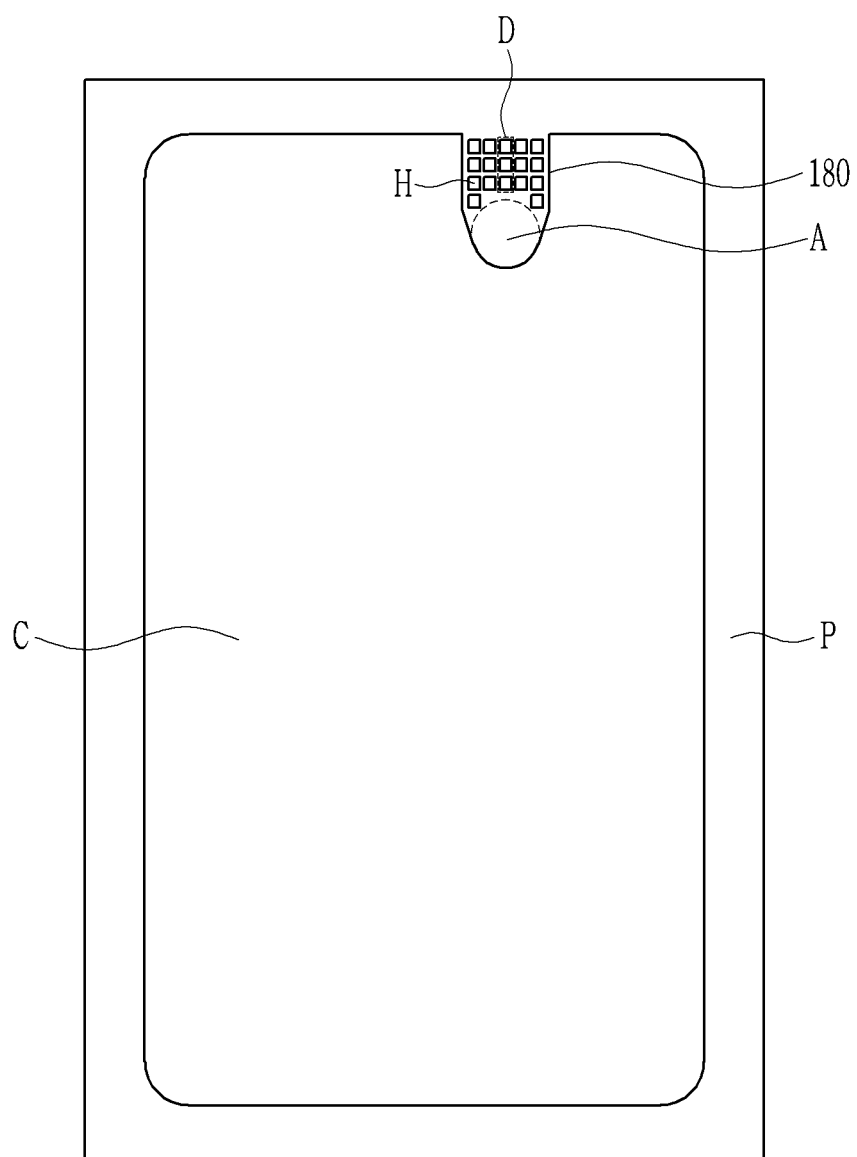

FIG. 20 is a plan view illustrating an open mask for an evaporation deposition process to form at least one selected from the group of the common HTL 22*a*, the common ETL 22*c*, the common upper electrode 23, and the common organic passivation layer 24 according to exemplary embodiments.

The open mask in FIG. 20 may be substantially the same as the open mask described in FIG. 19 except for a single connecting bar 180. The single connecting bar 180 may be disposed between a region P and a region A.

A width of the connecting bar 180 shown in FIG. 20 may be substantially larger than a diameter of the region A. As one alternative, the width of the connecting bar 180 may be substantially equal to the diameter of the region A. As another alternative, the width of the connecting bar 180 may be substantially smaller than the diameter of the region A.

It may be preferable that the connecting bar 180 may be connected to the peripheral region closest to the region A.

According to exemplary embodiments, the holes H may not be formed in the region D in FIG. 20. In this case, the display region 100 having a portion patterned like a substantial "Ω" shown in FIG. 1 may be formed.

An open mask according to exemplary embodiments will be described with reference to FIG. 21.

Figure 21:
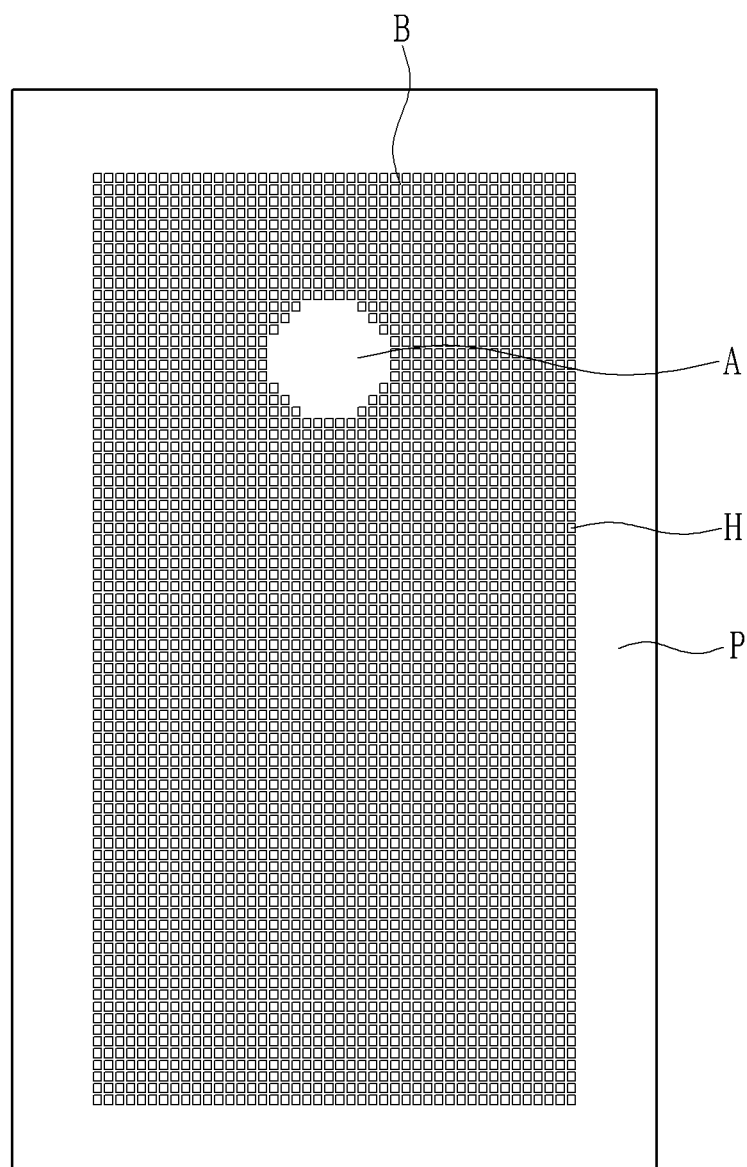

FIG. 21 is a plan view illustrating an open mask for an evaporation deposition process to form at least one selected from the group of the common HTL 22a, the common ETL 22c, the common upper electrode 23, and the common organic passivation layer 24 in FIG. 18 according to exemplary embodiments.

In the evaporation deposition process for forming at least one selected from the group of the common HTL 22a, the common ETL 22c, the common upper electrode 23, and the common organic passivation layer 24, a region A of the open mask may be adjacent to the first spacer 21a in FIG. 18 such that the at least one selected from the group of the common HTL 22a, the common ETL 22c, the common upper electrode 23, and the common organic passivation layer 24 may not be formed on the first spacer 21a. Accordingly, the light transmittance deterioration of the light transmitting region 210, the light transmittance deterioration being generated when the at least one selected from the group of the common HTL 22a, the common ETL 22c, the common upper electrode 23, and the common organic passivation layer 24e may be formed on the first spacer 21a, may be prevented.

A region B, i.e., a rigid portion, having a plurality of holes H may be formed in a peripheral region of a region A such that at least one selected from the group of the common HTL 22a, the common ETL 22c, the common upper electrode 23, and the common organic passivation layer 24 may be deposited through the holes H.

The at least one selected from the group of the common HTL 22a, the common ETL 22c, the common upper electrode 23, and the common organic passivation layer 24 may not be formed on the second spacer 21b overlapping the region B. The at least one selected from the group of the common HTL 22a, the common ETL 22c, the common upper electrode 23, and the common organic passivation layer 24 may be formed on the second spacer 21b overlapping the hole H.

An electroluminescent device formed by using the mask in FIGS. 19 to 21 will be described with reference to FIG. 22 and FIG. 23.

Figure 22:
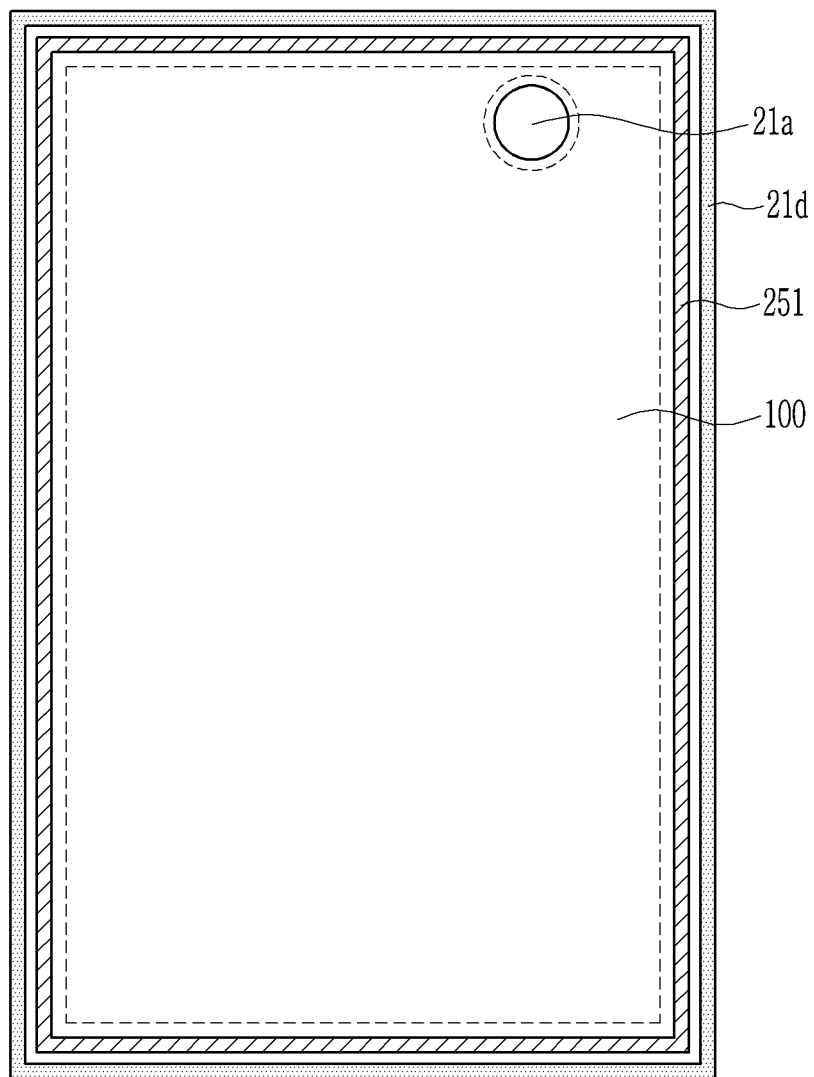
FIG. 22 and FIG. 23 are plan views illustrating an electroluminescent device formed by using an open mask shown in FIG. 19, FIG. 20, or FIG. 21 according to exemplary embodiments.
Figure 23:
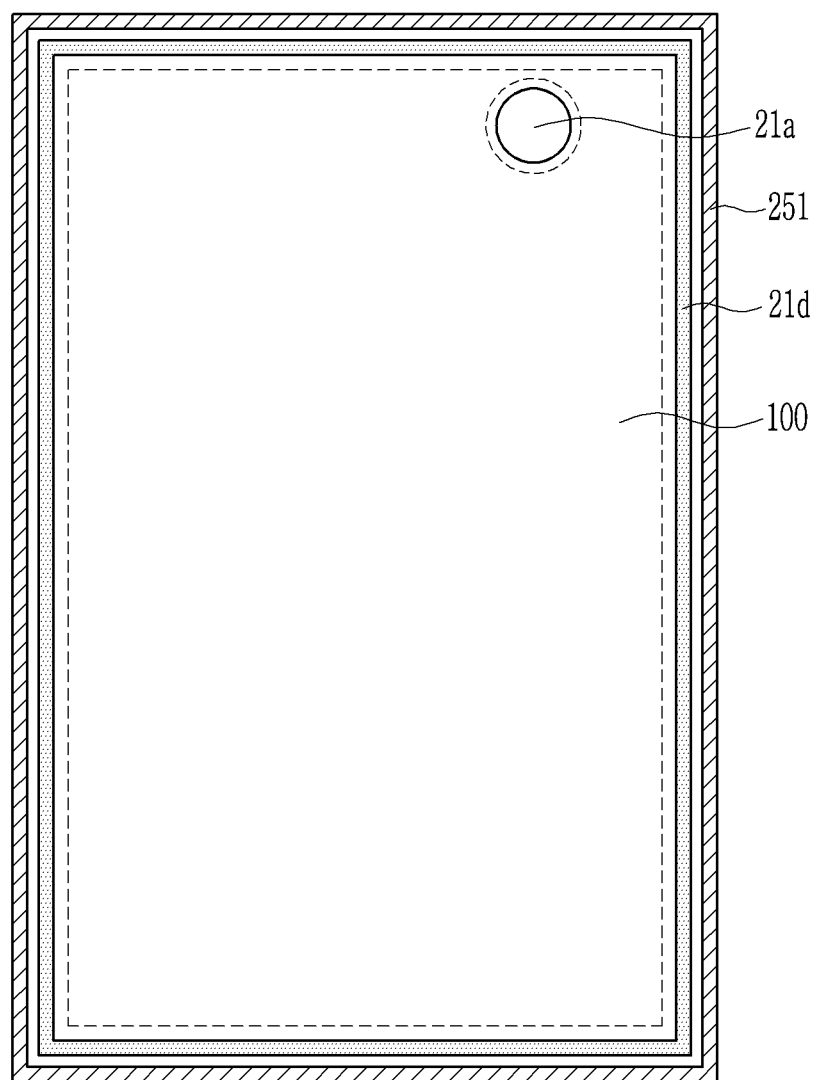

FIG. 22 and FIG. 23 are plan views illustrating an electroluminescent device having a display region 100, a first spacer 21a, a fourth spacer 21d, and an inorganic-inorganic encapsulation contact region 251 and formed by using the open mask shown in FIG. 19, FIG. 20, or FIG. 21 according to exemplary embodiments.

Referring to FIG. 22, the first spacer 21a may be surrounded by the display region 100 in a plan view. The inorganic-inorganic encapsulation contact region 251 may surround the display region 100 in a plan view. The fourth spacer 21d may surround the inorganic-inorganic encapsulation contact region 251 in a plan view. The first spacer 21a and the fourth spacer 21d may have substantially the same height. The region A in FIGS. 19 to 21 may correspond to the first spacer 21a such that the region A may be in contact with or may be adjacent to the first spacer 21a. The region P in FIGS. 19 to 21 may correspond to the fourth spacer 21d such that the region P may be in contact with or may be adjacent to the fourth spacer 21d.

Referring to FIG. 23, the first spacer 21a may be surrounded by the display region 100 in a plan view. The display region 100 may be surrounded by the fourth spacer 21d in a plan view. The fourth spacer 21d may have substantially the same height as the first spacer 21a. The fourth spacer 21d may be surrounded by the inorganic-inorganic encapsulation contact region 251 in a plan view. The fourth spacer 21d may surround the inorganic-inorganic encapsulation contact region 251 in a plan view. The first spacer 21a and the fourth spacer 21d may have substantially the same height. The region A in FIGS. 19 to 21 may correspond to the first spacer 21a such that the region A may be in contact with or adjacent to the first spacer 21a. The region P in FIGS. 19 to 21 may correspond to the fourth spacer 21d such that the region P may be in contact with or may be adjacent to the fourth spacer 21d.

Hereinafter, an open mask in FIG. 18 according to exemplary embodiments will be described with reference to FIG. 24.

Figure 24:
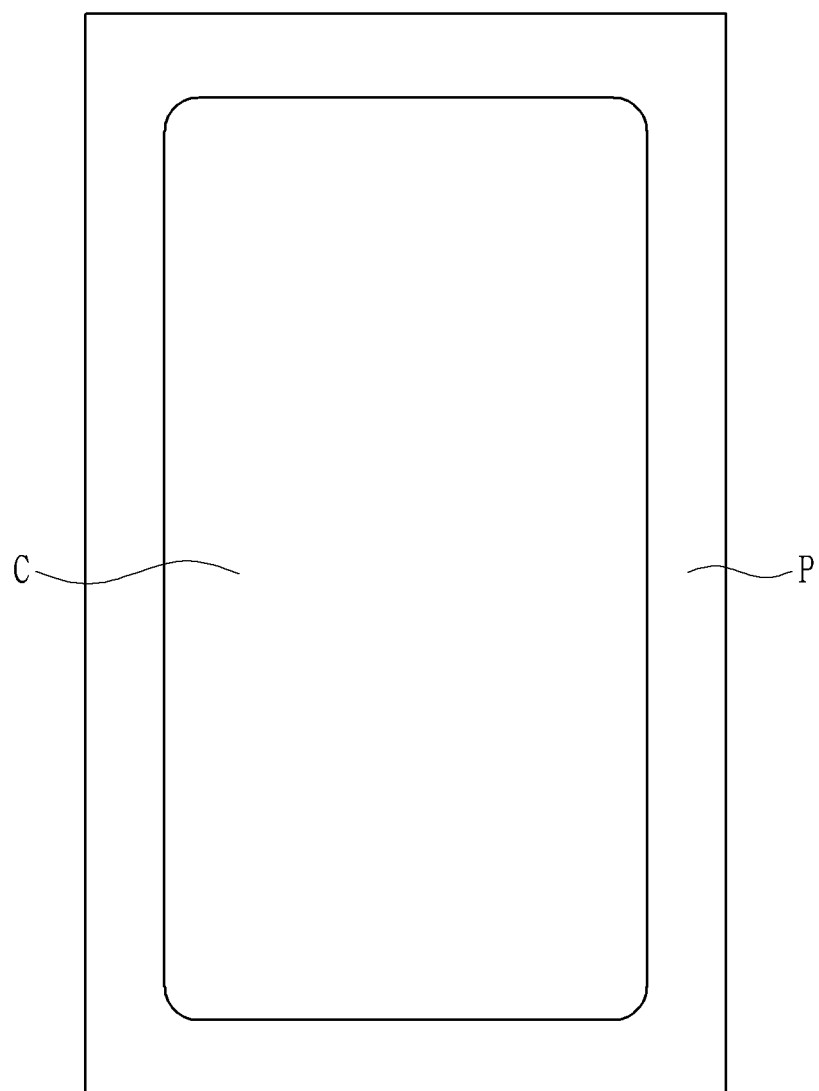
FIG. 24 is a plan view illustrating an open mask for an evaporation deposition process according to exemplary embodiments.

FIG. 24 is a plan view illustrating an open mask for an evaporation deposition process to form at least one selected from the group of the common HTL 22a, the common ETL 22c, the common upper electrode 23, and the common organic passivation layer 24 in FIG. 18 according to exemplary embodiments.

When using the open mask in FIG. 24, at least one selected from the group of the common HTL 22a, the common ETL 22c, the common upper electrode 23, and the common organic passivation layer 24 may be disposed on the spacer 21a in FIG. 18. However, when considering that the common HTL 22a, the common ETL 22c, and the common organic passivation layer 24 may include organic materials and the common upper electrode 23 may be a semi-transparent electrode for a top emission type, a light transmittance of the light transmitting region 210 may not be excessively reduced. Because an individual mask substantially similar to the individual mask in FIG. 12 except for a position of the region A may be used here, the individual emission layer 22b may not be formed on the first spacer 21a. Therefore, the open mask like FIG. 24 may be used.

Exemplary variations of FIG. 18 will be described with reference to FIG. 25.

Figure 25:
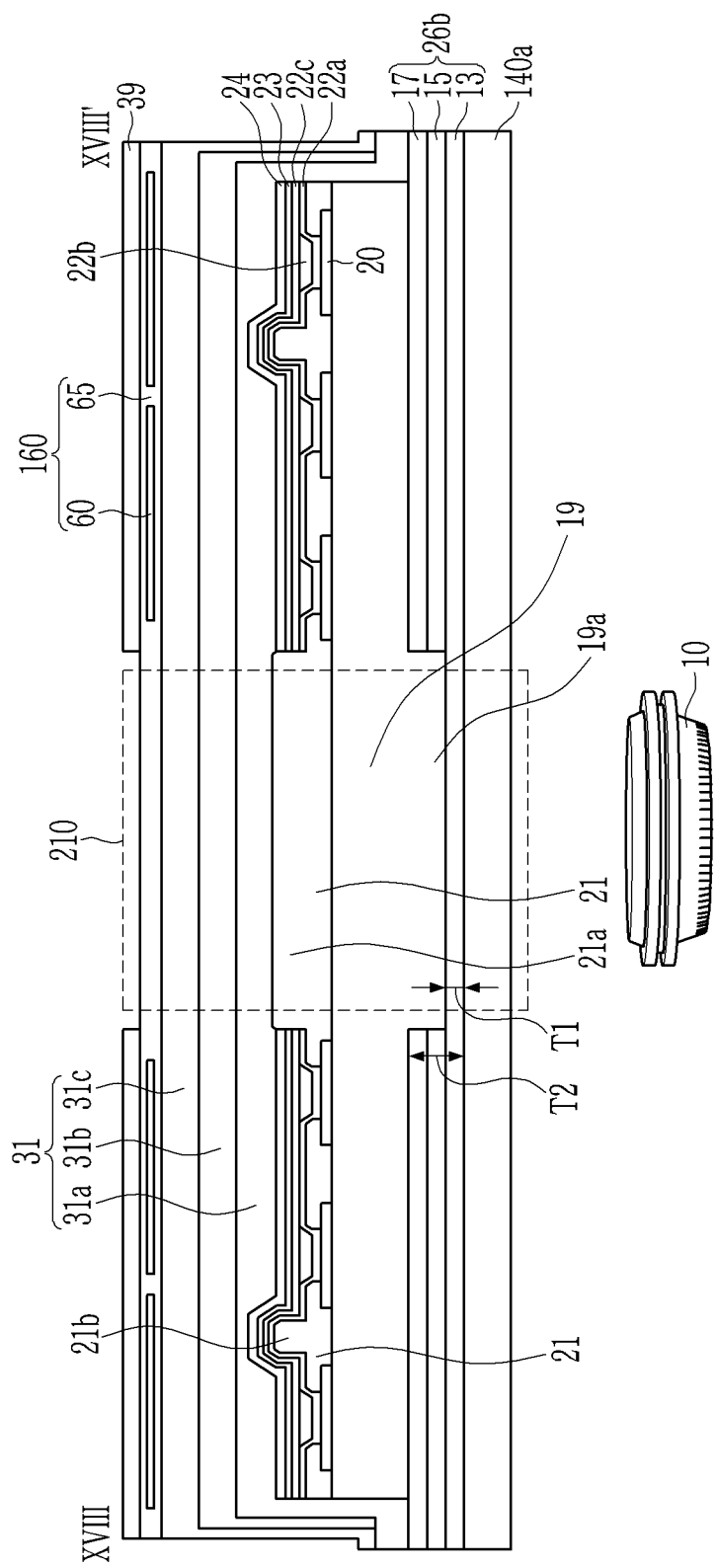
FIG. 25 is a cross-sectional view illustrating an electroluminescent device according to exemplary embodiments.

FIG. 25 is a cross-sectional view illustrating an electroluminescent device according to exemplary embodiments.

Referring to FIG. 25, a multi-layered encapsulation layer 31 may be employed instead of the inorganic frit 250 and the upper glass substrate 150 in FIG. 18. The lower transparent organic polymer substrate 140a may be employed instead of the lower glass substrate 140 in FIG. 18. FIG. 25 may be substantially the same as FIG. 18 except for the above-described aspects and, thus, the description of the same parts will be omitted.

In the exemplary embodiment in FIG. 25, a second thickness T2 of a second portion of the inorganic multilayer 26b, the second portion including the first, second and third inorganic layers 13, 15, and 17, may be substantially greater than a first thickness T1 of a first portion of the inorganic multilayer 26b, the first portion having a recess.

In FIG. 25, an inorganic passivation layer may not be shown on the common organic passivation layer 24. However, the inorganic passivation layer may be formed on the common organic passivation layer 24. The inorganic passivation layer may include a semi-conductive material or a conductive material. Examples of a material included in the inorganic passivation layer may include a lithium fluoride (LiF). The LiF may be a material capable of being deposited by an evaporation deposition process. Therefore, when the LiF may be deposited by the evaporation deposition process, the work function of the common upper electrode 23 may not be changed. This may be because plasma damaging to the common upper electrode 23 in the PE-CVD process may not occur in the evaporation process. The inorganic passivation layer may be in contact with the common organic passivation layer 24. The inorganic passivation layer may be a common layer covering the first spacer 21a to strongly protect the common upper electrode 23. Alternatively, the inorganic passivation layer may be a common layer not covering the first spacer 21a to improve the light transmittance of the light transmitting region 210. When the inorganic passivation layer may be the common layer covering the first spacer 21a, the mask shown in FIG. 24 may be used to form the inorganic passivation layer. When the inorganic passivation layer may be the common layer not covering the first spacer 21a, the mask described in FIGS. 19 to 21 may be used to form the inorganic passivation layer.

According to exemplary embodiments, the electroluminescent device may have at least two light transmitting regions 210 in FIG. 1, at least two light transmitting regions 210 in FIG. 16, or at least two light transmitting regions 210 in FIG. 17. Alternatively, the electroluminescent device may have at least two different kinds of light transmitting regions 210 among the light transmitting region 210 in FIG. 1, the light transmitting region 210 in FIG. 16, and the light transmitting region 210 in FIG. 17.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An electroluminescent device, comprising:
 a lower substrate which is a glass substrate or an organic polymer substrate;
 a lower structure disposed on the lower substrate and including an inorganic multilayer being in contact with the lower substrate; and
 an upper encapsulation structure disposed on the lower structure,
 wherein the lower structure includes:
  a display region defined inside an outline of the inorganic multilayer in plan view; and
  a light transmitting region defined inside the outline of the inorganic multilayer in plan view and having a non-through-hole structure having at least a portion surrounded by the display region in plan view,
 wherein the upper encapsulation structure overlaps the light transmitting region,
 wherein the display region is substantially opaque,
 wherein the display region comprises a plurality of electroluminescent units, the electroluminescent unit including a reflecting electrode which is an individual layer, formed on a planarization structure and has a side portion covered by a pixel definition layer on the planarization structure, an intermediate multilayer on the reflecting electrode, and a semi-transparent electrode on the intermediate multilayer, the semi-transparent electrode being a common layer,
 wherein the lower structure has an inorganic surface portion surrounding the display region and the light transmitting region in plan view, the upper encapsulation structure has an inorganic lower surface, and the inorganic lower surface of the upper encapsulation structure is in contact with the inorganic surface portion of the lower structure to form an inorganic-inorganic encapsulation contact region surrounding the display region and the light transmitting region in plan view,
 wherein the electroluminescent device does not have a hole formed through both the lower substrate and the lower structure, a portion of the upper encapsulation structure, the portion corresponding to the light transmitting region, is not removed, and the portion of the upper encapsulation structure is surrounded by the inorganic-inorganic encapsulation contact region in plan view,
 wherein the light transmitting region includes a plurality of display pixels,
 wherein a portion of the planarization structure, the portion corresponding to the light transmitting region, is not present, and
 wherein a portion of the pixel definition layer, the portion corresponding to the light transmitting region, is not present.

2. The electroluminescent device of claim 1, wherein the lower substrate is the glass substrate, and
 wherein an upper portion of the inorganic multilayer has at least one recess corresponding to the light transmitting region.

3. The electroluminescent device of claim 1, wherein the lower substrate is the glass substrate, and
 wherein the inorganic multilayer has at least one hole formed through the inorganic multilayer to correspond to the light transmitting region.

4. The electroluminescent device of claim 1, wherein the lower substrate is the organic polymer substrate, and
 wherein an upper portion of the inorganic multilayer has at least one recess corresponding to the light transmitting region.

5. The electroluminescent device of claim 4, wherein the inorganic multilayer includes an oxide layer and a nitride layer, and the oxide layer is partially removed by the at least one recess at the upper portion of the inorganic multilayer, and the nitride layer is not partially removed by the at least one recess at the upper portion of the inorganic multilayer.

6. The electroluminescent device of claim 1, wherein a recess is formed at a lower portion of the lower substrate to correspond to the light transmitting region.

7. The electroluminescent device of claim 1, wherein the inorganic multilayer does not have a hole formed through the inorganic multilayer, the hole corresponding to the light transmitting region, and
 wherein the lower substrate has a hole formed through the lower substrate to correspond to the light transmitting region.

8. The electroluminescent device of claim 7, wherein an upper portion of the inorganic multilayer has at least one recess corresponding to the light transmitting region.

9. The electroluminescent device of claim 1, wherein the lower structure further includes an external buffer region completely surrounding the display region and the light transmitting region in plan view and being completely surrounded by the inorganic-inorganic encapsulation contact region in plan view, and wherein the light transmitting region has a light transmittance higher than a light transmittance of the external buffer region.

10. The electroluminescent device of claim 9, wherein a portion of the external buffer region extends between the display region and the light transmitting region such that the display region and the light transmitting region are separated from each other by the portion of the external buffer region.

11. The electroluminescent device of claim 1, wherein a size of the light transmitting region is larger than a pixel circuit zone occupied by a pixel circuit for driving the electroluminescent unit.

12. The electroluminescent device of claim 11, wherein the light transmitting region has an area larger than one color unit including the electroluminescent units, which are neighboring, of different colors to achieve a white light.

13. The electroluminescent device of claim 1, wherein the intermediate multilayer includes at least one intermediate common layer, and wherein a portion of the at least one intermediate common layer, the portion corresponding to the light transmitting region, is not present.

14. The electroluminescent device of claim 1, wherein the electroluminescent device further comprises a polarization layer on the upper encapsulation structure, and wherein the polarization layer has a first portion corresponding to the display region and a second portion corresponding to the light transmitting region, a light transmittance of the second portion being substantially greater than that of the first portion.

15. The electroluminescent device of claim 1, wherein the electroluminescent device further comprises a color filter on the upper encapsulation structure, and wherein a portion of the color filter, the portion corresponding to the light transmitting region, is not present.

16. The electroluminescent device of claim 1, wherein the electroluminescent device further comprises a touch sensor on the upper encapsulation structure, the touch sensor including a touch electrode and a touch insulator being in contact with the touch electrode, and wherein a portion of the touch electrode, the portion corresponding to the light transmitting region, is not present.

17. The electroluminescent device of claim 16, wherein a portion of the touch insulator, the portion corresponding to the light transmitting region, is not present.

18. The electroluminescent device of claim 1, wherein a space where the portion of the planarization structure and the portion of the pixel definition layer are not present is at least partially filled with a filling structure including resin.

19. The electroluminescent device of claim 18, wherein the filling structure has a relatively good light transmittance compared to at least one selected from a group of the planarization structure and the pixel definition layer.

20. The electroluminescent device of claim 19, wherein the inorganic multilayer has at least one hole formed through the inorganic multilayer to correspond to the light transmitting region or at least one recess located at an upper portion of the inorganic multilayer to correspond to the light transmitting region, and wherein a space formed by the at least one hole or the at least one recess is at least partially filled with the filling structure.

21. The electroluminescent device of claim 1, wherein the intermediate multilayer includes at least one intermediate common layer, and wherein a portion of the at least one intermediate common layer, the portion corresponding to the light transmitting region, is present.

22. The electroluminescent device of claim 21, wherein the at least one intermediate common layer includes a common electron transport layer.

23. The electroluminescent device of claim 21, wherein the intermediate multilayer includes an emission layer pattern of individual emission layers, the individual emission layer being capable of emitting a light by a current flowing between the reflecting electrode and the semi-transparent electrode, a portion of the emission layer pattern, the portion corresponding to the light transmitting region, being not present.

24. The electroluminescent device of claim 23, wherein the at least one intermediate common layer includes a common electron transport layer.

25. The electroluminescent device of claim 1, wherein the intermediate multilayer includes an emission layer pattern of individual emission layers, the individual emission layer being capable of emitting a light by a current flowing between the reflecting electrode and the semi-transparent electrode, a portion of the emission layer pattern, the portion corresponding to the light transmitting region, being not present.

* * * * *